(12) United States Patent  (10) Patent No.: US 8,402,348 B1
Gunnam et al.  (45) Date of Patent: Mar. 19, 2013

(54) SYSTEMS AND METHODS FOR VARIABLE DATA PROCESSING USING A CENTRAL QUEUE

(75) Inventors: Kiran Gunnam, San Jose, CA (US); Shaohua Yang, San Jose, CA (US)

(73) Assignee: LSI Corporation, San Jose, CA (US)

( * ) Notice: Subject to any disclaimer, the term of this patent is extended or adjusted under 35 U.S.C. 154(b) by 320 days.

(21) Appl. No.: 12/785,416

(22) Filed: May 21, 2010

(51) Int. Cl.
*G11C 29/00* (2006.01)
(52) U.S. Cl. ........................................ 714/773
(58) Field of Classification Search ............... 714/773, 714/757, 721, 820, 769, 755, 805
See application file for complete search history.

(56) References Cited

U.S. PATENT DOCUMENTS

| | | | | |
|---|---|---|---|---|
| 4,112,258 | A | * | 9/1978 | Alles ............................ 370/378 |
| 4,876,734 | A | * | 10/1989 | Kawamura ................... 382/264 |
| 7,752,523 | B1 | | 7/2010 | Chaichanavong |
| 7,948,699 | B2 | * | 5/2011 | Liu et al. ......................... 360/39 |
| 2008/0276156 | A1 | | 11/2008 | Gunnam |
| 2008/0301521 | A1 | | 12/2008 | Gunnam |
| 2009/0282316 | A1 | * | 11/2009 | Lingam et al. ................ 714/763 |
| 2010/0050043 | A1 | | 2/2010 | Savin |

OTHER PUBLICATIONS

K. Gunnam et al., "Value-Reuse Properties of Min-Sum for GF(q)" (dated Oct. 2006) Dept. of ECE, Texas A&M University Technical Note, published about Aug. 2010.
K. Gunnam et al., "Value-Reuse Properties of Min-Sum for GF(q)"(dated Jul. 2008) Dept. of ECE, Texas A&M University Technical Note, published about Aug. 2010.
K. Gunnam "Area and Energy Efficient VLSI Architectures for Low-Density Parity-Check Decoders Using an On-The-Fly Computation" dissertation at Texas A&M University, Dec. 2006.

* cited by examiner

*Primary Examiner* — Fritz Alphonse
(74) *Attorney, Agent, or Firm* — Hamilton DeSanctis & Cha

(57) ABSTRACT

Various embodiments of the present invention provide systems and methods for data processing. For example, a data processing system is disclosed that includes two or more detection processing circuits, a decoder processing circuit and a memory. The memory is coupled to both of the data detection processing circuits and the decoder processing circuit. In some instances of the aforementioned embodiments, the system further includes a scheduling circuit that is operable to govern access to the memory by the detection processing circuits and the decoder processing circuit.

20 Claims, 14 Drawing Sheets

SYSTEMS AND METHODS FOR VARIABLE DATA PROCESSING USING A CENTRAL QUEUE

BACKGROUND OF THE INVENTION

The present inventions are related to systems and methods for detecting and/or decoding information, and more particularly to systems and methods for performing iterative data decoding and/or detection.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. The effectiveness of any transfer is impacted by any losses in data caused by various factors. In some cases, an encoding/decoding process is used to enhance the ability to detect a data error and to correct such data errors. As an example, a simple data detection and decode may be performed, however, such a simple process often lacks the capability to converge on a corrected data stream. To increase the possibility of convergence, various existing processes utilize two or more detection and decode iterations. In many cases, the aforementioned systems are inefficient.

Hence, for at least the aforementioned reasons, there exists a need in the art for advanced systems and methods for data processing.

BRIEF SUMMARY OF THE INVENTION

The present inventions are related to systems and methods for detecting and/or decoding information, and more particularly to systems and methods for performing iterative data decoding and/or detection.

Various embodiments of the present invention provide data processing systems that include two or more detection processing circuits, a decoder processing circuit and a memory. Each of the detection processing circuits is capable of processing distinct codewords or packets concurrently. The memory is coupled to both of the data detection processing circuits and the decoder processing circuit. In some instances of the aforementioned embodiments, the system further includes a scheduling circuit that is operable to govern access to the memory by the detection processing circuits and the decoder processing circuit.

In various instances of the aforementioned embodiments, at least one of the detection processing circuits includes a detector circuit and an interleaver circuit. In such instances, access to the memory by the detection processing circuit includes providing an interleaved output from the detector circuit to the memory. In some such instances, the detector circuit is operable to receive a data input and to provide a detected output based at least in part on the data input, and the interleaver circuit is operable to receive the detected output and to provide the interleaved output based at least in part on the detected output.

In some instances of the aforementioned embodiments, another of the detection processing circuits includes a detector circuit, an interleaver circuit and a de-interleaver circuit. In such instances, a write access to the memory by the detection processing circuit includes providing a detected output from the detector circuit to the memory via the interleaver circuit, and a read access from the memory by the detection processing circuit includes receiving an interleaved output from the memory at the de-interleaver circuit. In some such cases, upon a read access from the memory, the de-interleaver circuit is operable to receive an interleaved output from the memory and to provide a de-interleaved output to the detector circuit based at least in part on the interleaved output. In a particular instance, the read access from the memory by the detection processing circuit only occurs where a decoding algorithm applied by the decoder processing circuit fails to converge. In other such cases, upon a write access to the memory, the detector circuit is operable to receive a buffered data input and to provide a detected output based at least in part on the buffered data input, and the interleaver circuit is operable to receive the detected output and to provide the interleaved output based at least in part on the detected output.

In yet other instances of the aforementioned embodiments, the memory is a central memory, and the decoder processing circuit includes a decoder circuit and a ping-pong memory having a first memory region and a second memory region. In some such instances, the decoder circuit is a low density parity check decoder circuit. In one particular instance, upon a read access from the memory by the decoder processing circuit, a data set from the memory is written to the first memory region while the decoder circuit processes data from the second memory region. In another particular instance, upon a write access to the memory by the decoder processing circuit, a data set from the first memory region is provided to the memory while the decoder circuit processes data from the second memory region. In one case, the ping-pong memory is a first ping-pong memory, and the decoder processing circuit further comprises a second ping-pong memory having a third memory region and a fourth memory region. In such a case, the system further comprises a de-interleaver circuit and an output buffer. Upon convergence the decoder circuit writes data to the third memory region while data is provided from the fourth memory region to the output buffer via the de-interleaver circuit.

Other embodiments of the present invention provide storage devices that include a storage medium that is operable to store a data set; a data processing circuit that is operable to receive a representation of the data set. The data processing circuit includes: a memory coupled to a first data detection processing circuit, a second data detection processing circuit, and a decoder processing circuit. The first detection circuit is operable to apply a detection algorithm to the representation of the data set and to provide a first detected output to the memory. The decoder processing circuit is operable to apply a decoding algorithm to the first detected output and to provide a decoded output to the memory. The second detection processing circuit is operable to apply the detection algorithm to the decoded and to provide a second detected output to the memory.

Yet other embodiments of the present invention provide information transmission devices that include a radio frequency receiver and a data processing circuit. The radio frequency receiver is operable to receive a data set, and the data processing circuit is operable to receive a representation of the data set. The data processing circuit includes: a memory that is coupled to a first data detection processing circuit, a second data detection processing circuit, and a decoder processing circuit. The first detection circuit is operable to apply a detection algorithm to the representation of the data set and to provide a first detected output to the memory. The decoder processing circuit is operable to apply a decoding algorithm to the first detected output and to provide a decoded output to the memory. The second detection processing circuit is operable to apply the detection algorithm to the decoded and to provide a second detected output to the memory.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for detecting and/or decoding information, and more particularly to systems and methods for performing iterative data decoding and/or detection.

Various embodiments of the present invention provide hardware solutions for iterative decoding suitable for read channel, wireless transmission and other applications. In some cases, embodiments of the present invention provide central memory based approach to data detection and decoding. Such an approach allows for a variable number of iterations of data detection processes and/or data decoding processes to be performed based upon the needs of a given codeword. Such an approach allows less defective codewords to complete more quickly than more defective codewords by allowing more processing for more defective codewords and less processing for less defective codewords. The codewords can converge out of order and be re-assembled into their proper order at the end of processing. The processing may be completed with two or more detector circuits feeding a decoder circuit. In such cases, the decoder circuit may include a single decoder or multiple independent decoders, or a single decoder that operates at multiple times the rate required to process data from a single detector circuit. In the single decoder scenario, the decoder circuit provides an ability to time share decoding power between two or more ongoing detection and decoding processes within a single codeword time.

Figure 1:
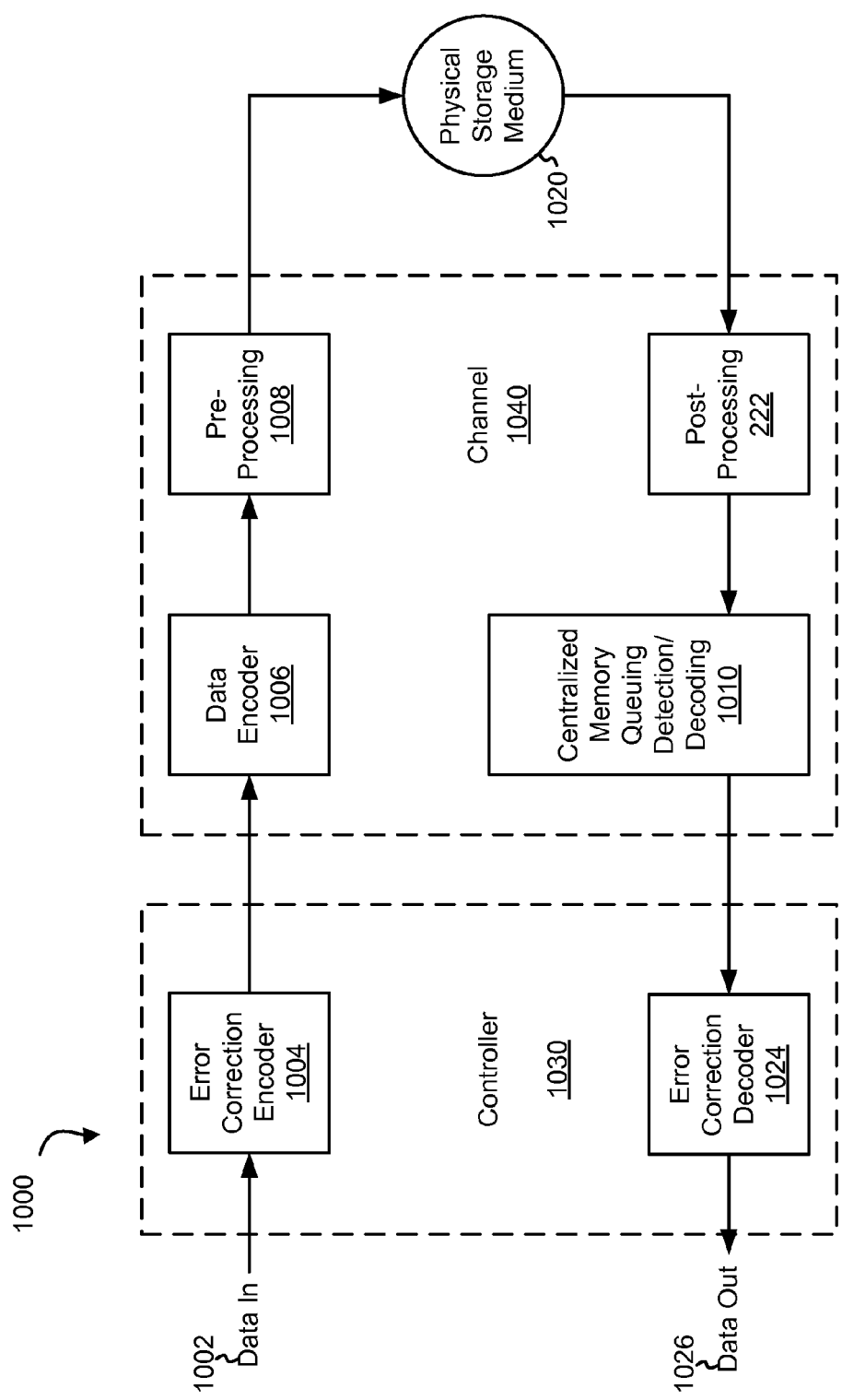
FIG. 1 depicts data storage system utilizing a centralized memory queuing detection/decoding system in accordance with some embodiments of the present invention.

Turning to FIG. 1, a storage system 1000 including a centralized memory queuing detection/decoding circuit 1010 is shown in accordance with some embodiments of the present invention. Storage system 1000 includes a controller 1030, a channel 1040, and a physical storage medium 1020. Physical storage medium 1020 may be, but is not limited to, a magnetic disk. Based on the disclosure provided herein, one of ordinary skill in the art will recognize a variety of physical storage media that may be used in relation to different embodiments of the present invention. Controller 1030 includes error correction encoding and decoding. In particular, controller 1030 includes an error correction encoder 1004. Error correction encoder 1004 may be any error correction encoder known in the art including, but not limited to, a Reed Solomon encoder or a CRC encoder, and error correction decoder 1024 may be, but is not limited to, a corresponding Reed Solomon decoder or CRC decoder. Both the aforementioned encoder and decoder may be any circuit or system known in the art that is capable of performing encoding and decoding processes. Channel 1040 includes a data encoder 1006 and a pre-processing circuit 1008. In some cases, data encoder 1006 is a Low Density Parity Check (LDPC) encoder. Based on the disclosure provided herein, one of ordinary skill in the art will recognize a variety of encoding processes and corresponding decoding processes that may be implemented in accordance with different embodiments of the present invention. Pre-processing circuit 1008 includes the various pre-processing circuitry that is well known in the art. Post-processing circuit 1022 includes the various post-processing circuitry that is well known in the art for receiving data from a physical storage medium and for preparing the received data for data detection and decoding.

In addition, channel 1040 includes centralized memory queuing detection/decoding circuit 1010 that is capable of performing a variable number of detection and decoding iterations depending upon processing availability and/or convergence. Such a centralized memory queuing detection/decoding circuit 1010 allows for performing a variable number of iterations on a given input, while minimizing the number of iterations that must be performed. To perform this function, completion of input processing may be done out of order with the results reassembled at a later point.

In operation, a data input 1002 is received. Data input 1002 may be any data set destined for storage on physical storage medium 1020. Data input 1002 is encoded using error correction encoder 1004 as is known in the art. The output of error correction encoder 1004 is provided to data encoder 1006 that may, for example, perform an LDPC encoding of the data. The output of data encoder 1006 is provided to pre-processing circuit 1008 that may convert the output from a digital output to an analog output satisfactory for writing to physical storage medium 1020.

The data previously written to physical storage medium 1020 may be subsequently retrieved and processed by post-processing circuit 1022. In one case, post-processing circuit 1022 performs an amplification of an analog data signal retrieved from physical storage medium 1020, and converts the amplified analog signal to a digital signal that is output to centralized memory queuing detection/decoding circuit 1010. In turn, centralized memory queuing detection/decoding circuit 1010 performs a variable number of data detection and data decoding processes until either the output of the process converges (i.e., it adequately represents the original data encoded by data encoder 1006) or until insufficient resources remain to perform additional processing. Centralized memory queuing detection/decoding circuit 1010 provides its result as an output to error correction decoder 1024. Error correction decoder 1024 performs the designated error correction processing to determine whether any errors remain and if detected, attempts to correct the errors. Once the error correction processes are completed, error correction decoder 1024 provides a data output 1026. In general, data output 1026 corresponds to data input 1002 that was originally provided for writing to physical storage medium 1020.

Figure 2:
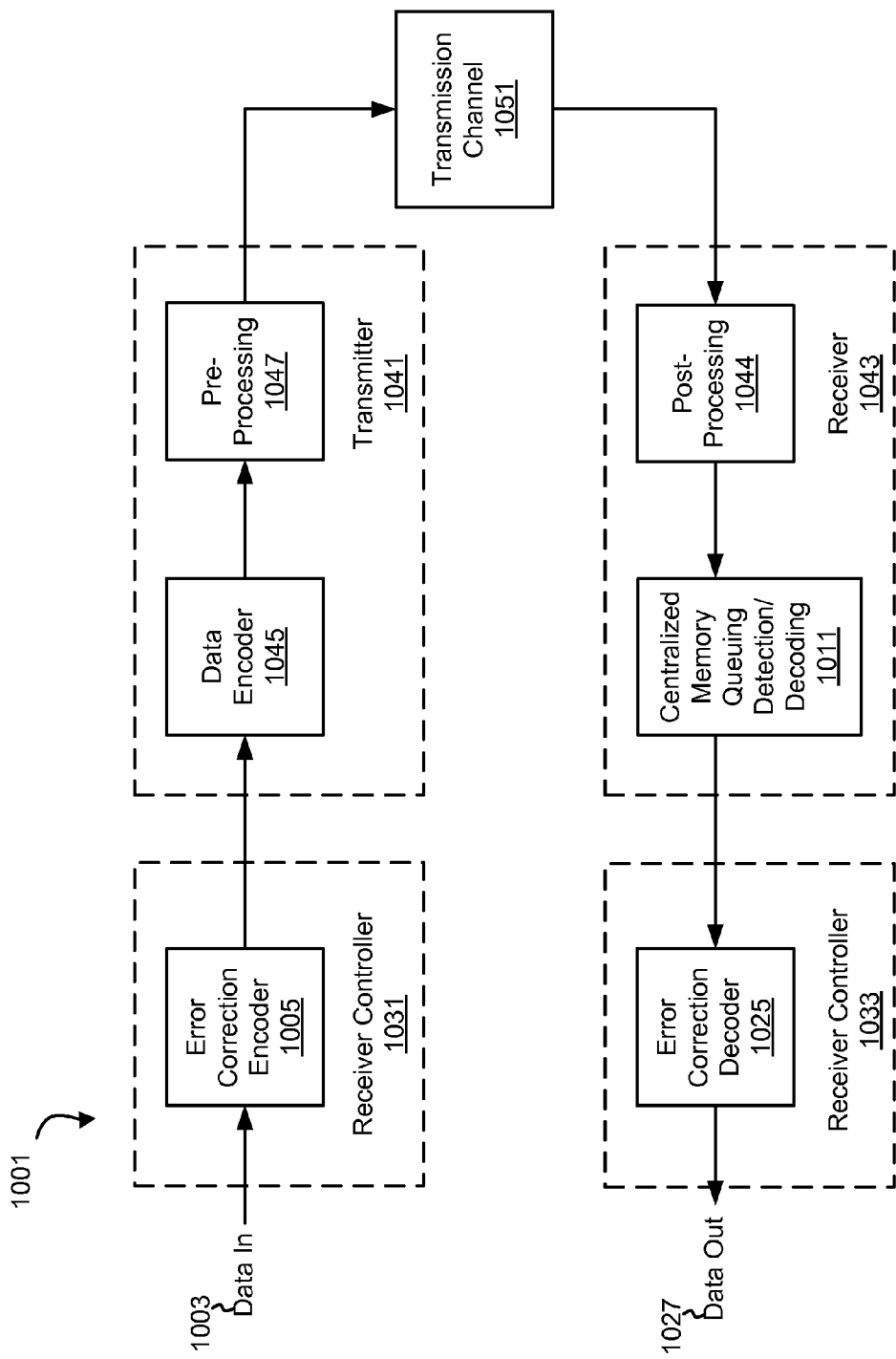
FIG. 2 depicts a data transfer system utilizing a centralized memory queuing detection/decoding system in accordance with other embodiments of the present invention.

Turning to FIG. 2, a transmission system 1001 including a centralized memory queuing detection/decoding circuit 1011 is depicted in accordance with some embodiments of the present invention. Transmission system 1001 includes a transmission controller 1031, a transmitter 1041, a transmission channel 1051, a receiver 1043, and a receiver controller 1033. Transmission channel may be, but is not limited to, an RF transmission channel. Based on the disclosure provided herein, one of ordinary skill in the art will recognize a variety of transmission channels that may be used in relation to different embodiments of the present invention. Transmission controller 1031 includes an error correction encoder that may be implemented, for example, as a Reed Solomon encoder or a CRC encoder. Similarly, receiver controller 1033 includes an error correction decoder 1025 corresponding to error correction encoder 1005. Thus, error correction decoder 1025 may be, for example, a CRC decoder or a Reed Solomon decoder. Both the aforementioned encoder and decoder may be any circuit or system known in the art that is capable of performing encoding and decoding processes. Based on the disclosure provided herein, one of ordinary skill in the art will recognize a variety of error correction encoder/decoder approaches that may be used in relation to different embodiments of the present invention.

Transmitter 1041 includes a data encoder 1045 and a pre-processing circuit 1047. In some cases, data encoder 1045 is an LDPC encoder. Based on the disclosure provided herein, one of ordinary skill in the art will recognize a variety of encoding processes that may be implemented in accordance with different embodiments of the present invention. Pre-processing circuit 1047 includes the various pre-processing circuitry that is well known in the art. In one particular case, pre-processing circuit 1047 is operable to convert a digital data set from data encoder 1045 to a corresponding RF signal suitable for transmission via transmission channel 1051. The data set transferred via transmission channel 1051 is received using a post-processing circuit 1049 of receiver 1043. Post-processing circuit 1049 includes the various post-processing circuitry that is well known in the art for receiving data from a transmission channel and for preparing the received data for data detection and decoding.

In addition, receiver 1043 includes centralized memory queuing detection/decoding circuit 1011 that is capable of performing a variable number of detection and decoding iterations depending upon processing availability and/or convergence. Such a centralized memory queuing detection/decoding circuit 1011 allows for performing a variable number of iterations on a given input, while minimizing the number of iterations that must be performed. To perform this function, completion of input processing may be done out of order with the results reassembled at a later point.

In operation, a data input 1003 is received. Data input 1003 may be any data set destined for transmission via transmission channel 1031. Data input 1003 is encoded using error correction encoder 1005 as is known in the art. The output of error correction encoder 1005 is provided to data encoder 1045 that may, for example, perform an LDPC encoding of the data. The output of data encoder 1045 is provided to pre-processing circuit 1047 that may convert the output from a digital output to an analog output satisfactory for transmission via transmission channel 1051.

The data transmitted via transmission channel 1051 is received and processed by post-processing circuit 1049 of receiver 1043. In one case, post-processing circuit 1049 performs an amplification of an analog data signal retrieved from transmission channel 1051, and converts the amplified analog signal to a digital signal that is output to centralized memory queuing detection/decoding circuit 1011. In turn, centralized memory queuing detection/decoding circuit 1011 performs a variable number of data detection and data decoding processes until either the output of the processes converges (i.e., it adequately represents the original data encoded by data encoder 1045) or until insufficient resources remain to perform additional processing. Centralized memory queuing detection/decoding circuit 1011 provides its result as an output to error correction decoder 1025. Error correction decoder 1025 performs the designated error correction processing to determine whether any errors remain and if detected, attempts to correct the errors. Once the error correction processes are completed, error correction decoder 1025 provides a data output 1027. In general, data output 1027 corresponds to data input 1003 that was originally provided for transmission via transmission channel 1051.

It should be noted that while FIGS. 1-2 depict a storage system and a transmission system to which a queuing detection/decoding circuit and/or process may be applied, that there are a variety of systems in which queuing detection/decoding circuits in accordance with different embodiments of the present invention may be applied. Based on the disclosure provided herein, one of ordinary skill in the art will recognize a variety of systems that may be benefited by use of a queuing detection/decoding circuit and/or process in accordance with different embodiments of the present invention.

Figure 3:
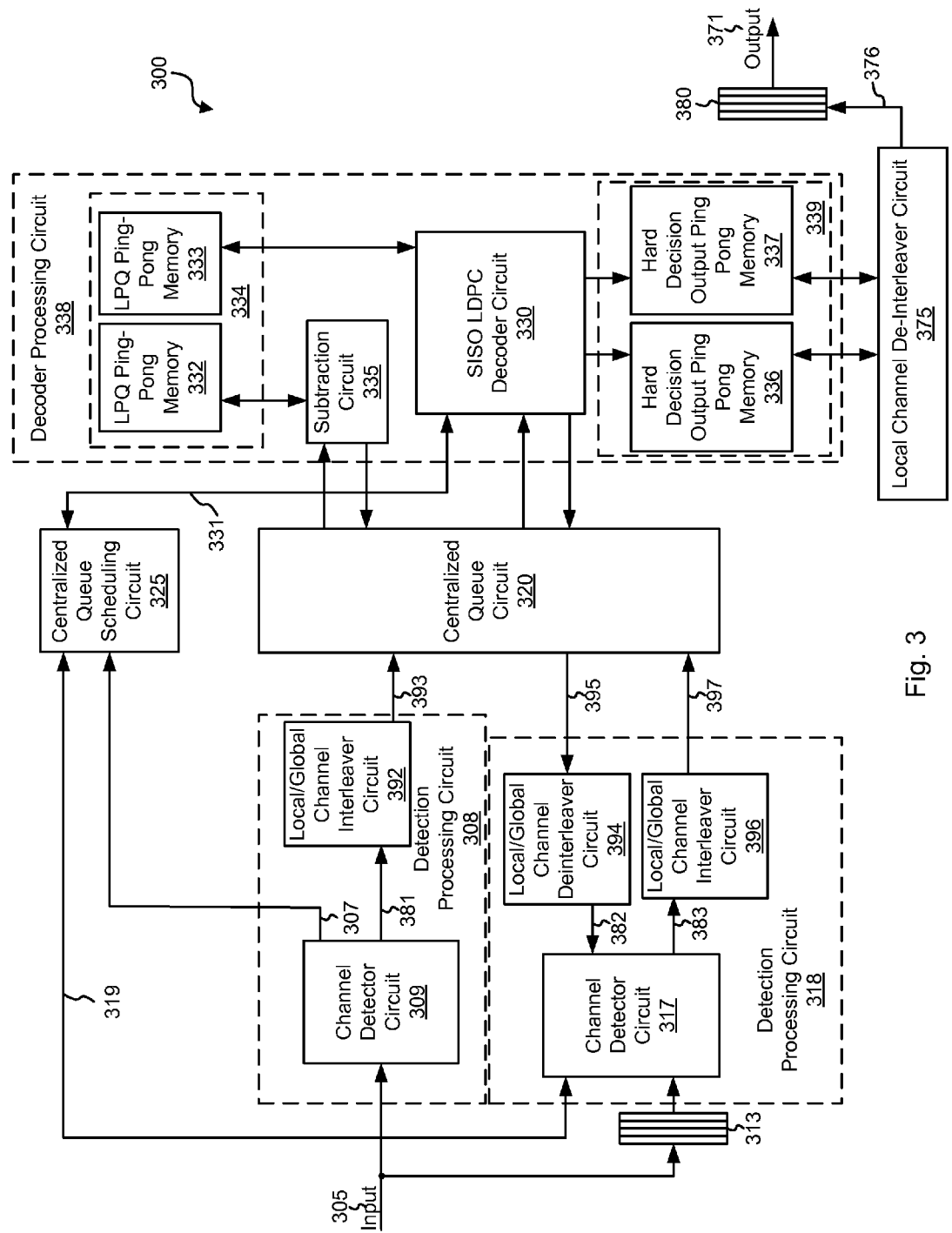
FIG. 3 shows a centralized memory queuing detection/decoding system in accordance with various embodiments of the present invention.

Turning to FIG. 3, a centralized memory queuing detection/decoding system 301 is depicted in accordance with various other embodiments of the present invention. Centralized memory queuing detection/decoding circuit 301 includes a data input 305 that is fed to a detection processing circuit 308. Detection processing circuit 308 includes a channel detector circuit 309 and a local/global channel interleaver circuit 392. Channel detector circuit 309 may be any type of channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention. Local/global channel interleaver circuit 392 receives a detected output 381 from channel detector circuit 309 and performs an interleaving process on the received data. The interleaving process operates to shuffle the received data in accordance with a known algorithm to distribute any localized noise across a larger data set such that a later decoding process is less susceptible to failure due to high noise density areas of a received codeword. Based upon the disclosure provided herein, one of ordinary skill in the art will recognize a variety of shuffle or interleaving algorithms that may be used in relation to various embodiments of the present invention. An interleaved output 393 is provided to a centralized queue circuit 320. It should be noted that in some embodiments of the present invention detection processing circuit 308 includes only channel detector circuit 309. In such cases, detected output 381 is provided directly to a centralized queue circuit 320. A processing status signal 307 of channel detector circuit 309 is provided to a centralized queue scheduling circuit 325. In some cases, processing status signal 307 indicates a completion of processing of a data set provided as data input 305 (i.e., the availability of the completed data set in centralized queue circuit 320).

In addition, data input 305 is provided to a memory buffer 313 that is designed to hold a number of data sets received from data input 305. The size of memory buffer 313 may be selected to provide sufficient buffering such that a data set received via data input 305 remains available at least until a first iteration processing of that same data set is complete and the processed data is available in centralized queue circuit 320 as more fully described below. Memory buffer 313 provides the data sets to a detection processing circuit 318. Detection processing circuit 318 includes a channel detector circuit 317, a local/global channel de-interleaver circuit 394, and a local/global channel interleaver circuit 396. Channel detector circuit 317 may be any type of channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention.

Local/global channel interleaver circuit 396 receives a detected output 383 from channel detector circuit 317 and performs an interleaving process on the received data. Similar to that described above in relation to local/global channel interleaver circuit 392, the interleaving process operates to shuffle the received data in accordance with a known algorithm to distribute any localized noise across a larger data set such that a later decoding process is less susceptible to failure due to high noise density areas of a received codeword. Based upon the disclosure provided herein, one of ordinary skill in the art will recognize a variety of shuffle algorithms that may be used in relation to various embodiments of the present invention. An interleaved output 397 is provided to centralized queue circuit 320.

Local/global channel de-interleaver circuit 394 receives an interleaved data set 395 from centralized queue circuit 320. Local/global channel de-interleaver circuit 394 reverses the shuffling that was applied by either local/global channel interleaver circuit 396 or local/global channel interleaver circuit 392. Local/global channel de-interleaver circuit 394 provides a de-interleaved output 382 to channel detector circuit 317. Based on the disclosure provided herein, one of ordinary skill in the art will recognize a variety of de-interleaving approaches that may be used in relation to different embodiments of the present invention.

A processing status signal 319 is provided between centralized queue scheduling circuit 325 and channel detector circuit 317. In some cases, processing status signal 319 indicates a completion of processing of a data set when one signal of processing status signal 319 is asserted by channel detector circuit 317, and authorization to begin accessing a data set from centralized queue circuit 320 is indicated when centralized queue scheduling circuit 325 asserts another signal in processing status signal 319.

Centralized queue circuit 320 is a storage circuit capable of maintaining data sets provided by detection processing circuit 308, data sets provided by detection processing circuit 318, and data sets provided by a decoder processing circuit 338. In some cases, centralized queue circuit 320 is a dual port memory allowing accesses by two requestors at a time. In other cases, centralized queue circuit 320 is a single port memory allowing accesses by only one requestor at a time. In various cases, a write after read access is used to increase the usage of a single port implementation. Write after read permits the sharing of same memory space allocated for a codeword by another codeword. In essence, memory allocated for the incoming codeword at the memory row level as the outgoing codeword is vacating the space occupied a memory row.

Data sets previously processed by detection processing circuit 308 or detection processing circuit 318 are decoded by decoder processing circuit 338. Decoder processing circuit 338 includes a soft input/soft output (SISO) low density parity check (LDPC) decoder circuit 330, a decoder memory circuit 334 and a decoder memory circuit 339. Decoder memory circuit 334 includes a ping-pong memory 332 and a ping-pong memory 333. Decoder memory circuit 339 includes a ping-pong memory 336 and a ping-pong memory 337. In operation, decoder processing circuit 338 loads data provided from centralized queue circuit 320 into one of ping-pong memory 332 or ping-pong memory 333. At the same time, LDPC decoder circuit 330 applies a data decoding algorithm to the data set maintained in ping-pong memory 333. During the decoding process, LDPC decoder circuit 330 uses ping-pong memory 333 as a processing memory. Where the decoding process fails to converge, decoder processing circuit 338 writes the decoded data set from ping-pong memory 333 to centralized queue circuit 320 via a subtraction circuit 335. Subtraction circuit 335 pulls the L messages previously written to centralized queue circuit 320 by one of the data detection processing circuits 308, 318 and subtracts the corresponding P messages generated by LDPC decoder circuit 330 to yield the extrinsic values (i.e., the E messages). The resulting E messages are written back to centralized queue circuit 320 as ping-pong memory 333 is unloaded. Concurrently, LDPC decoder circuit 330 applies a data decoding algorithm to the data set previously loaded into ping-pong memory 332. During this processing, LDPC decoder circuit 330 uses ping-pong memory 332 as a processing memory.

In one particular embodiment of the present invention, LDPC decoder circuit 330 is operable to perform a total of fifteen local iterations (i.e., a pass through LDPC decoder circuit 330) spread across three global iterations (i.e., a pass through one or detection processing circuits 308, 318 and LDPC decoder circuit 330). In such a case, each of detection processing circuits 308, 318 and decoder processing circuit 338 are operating on a distinct data sets at any given time allowing for processing in each to be performed without interaction with the other. In some cases, each of detection processing circuits 308, 318 processes four samples per clock cycle Alternatively, where the processing of the data set maintained in ping-pong memory 333 converges, the converged data is written out to one of hard decision ping-pong memory 336 or hard decision ping-pong memory 337. Concurrently, any converged data set maintained in the other of hard decision ping-pong memory 336 or hard decision ping-pong memory 337 is unloaded to a local channel de-interleaver circuit 375. Local channel de-interleaver circuit 375 reverses the shuffling that was applied by either local/global channel interleaver circuit 396 or local/global channel interleaver circuit 392. The resulting de-interleaved data set 376 is written to one buffer area of an output buffer 380.

Centralized memory queuing detection/decoding circuit 301 allows for performance of a variable number of detection and decoding iterations depending upon the introduced data. Further, in some cases, considerable power savings may be achieved through use of centralized memory queuing detection/decoding circuit 301. Yet further, in some cases, a faster LDPC decoder may be implemented allowing for an increased throughput where substantial first iteration data convergence exists as multiple iterations are not necessarily required. Yet further, by allowing results of LDPC decoder circuit 330 to be reported out of order via decoder memory circuit 339, upstream processing does not have to wait for the completion of downstream processing. Re-ordering of the out of order results may be done by centralized memory queuing detection/decoding circuit 301 or by a downstream recipient of an output 371.

A processing status signal 331 is provided between decoder processing circuit 338 and centralized queue scheduling circuit 325. In some cases, processing status signal 331 indicates a completion of processing of a data set when one signal of processing status signal 331 is asserted by decoder processing circuit 338, and authorization to begin accessing a data set from centralized queue circuit 320 is indicated when centralized queue scheduling circuit 325 asserts another signal in processing status signal 331.

Centralized queue scheduling circuit 325 is responsible for controlling access into and out of centralized queue circuit 320, and for directing the data to be processed by detection processing circuit 318 and decoder processing circuit 338 during any given time increment. As such, processing status signal 331 provides an indication of which data is to be accessed by decoder processing circuit 338 when access to centralized queue circuit 320 is granted, and processing status signal 319 provides an indication of which data is to be accessed by detection processing circuit 318 when access to centralized queue circuit 320 is granted. When centralized queue scheduling circuit 325 indicates via processing status signal 319 that access is available into centralized queue circuit by detection processing circuit 318, it also indicates the previously decoded data set that is to be retrieved from centralized queue circuit 320. Similarly, when centralized queue scheduling circuit 325 indicates via processing status signal 331 that access is available into centralized queue circuit by decoder processing circuit 338, it also indicates the previously detected data set that is to be retrieved from centralized queue circuit 320.

Centralized queue scheduling circuit 325 determines what data is to be processed next based upon various quality metrics generated by decoder processing circuit 338. Such quality metrics may include, but are not limited to, a number of remaining errors in a given data set. As an example, where a data set is very close to converging (i.e., it has only limited remaining errors) it may be selected to go before another data set under a theory that the data set will finish on the next pass. Alternatively, a data set that is nearing a timeout condition may be selected to be processed earlier than one having a large amount of time remaining. As yet another alternative, a data set may be selected based on nearing a maximum latency threshold dictated by the depth of output buffer 380. As yet a further example, the oldest waiting codeword after the previous detection may be selected. Based upon the disclosure provided herein, one of ordinary skill in the art will recognize a variety of metrics and corresponding scheduling criteria that may be used in relation to different embodiments of the present invention. In one particular embodiment of the present invention, all of the data sets traversing centralized memory queuing detection/decoding system 301 may be preempted such that processing proceeds in accordance with the quality metrics utilized by centralized queue scheduling circuit 325 to provide process ordering.

It should be noted that in different embodiments of the present invention that various of the circuits in centralized memory queuing detection/decoding system 301 may be interconnected in different ways. For example, local channel de-interleaver circuit 375 may be connected between output buffer 380 and output 371 with the outputs from decoder memory 339 provided directly to output buffer 380. As another example, the local de-interleaver portion of local/global channel de-interleaver circuit 394 may be connected between channel detector circuit 317 and centralized queue circuit 320 and the local interleaver portion of local/global channel interleaver circuit 396 may be connected between channel detector circuit 317 and centralized queue circuit 320 with the global de-interleaver portion of local/global channel de-interleaver circuit 394 and the global interleaver portion of local/global channel interleaver circuit 396 being implemented between centralized queue circuit 320 and decoder memory 334. As yet another example, all of local/global channel de-interleaver circuit 394, local/global channel interleaver circuit 396 and portion of local interleaver circuit 392 may be implemented as a combined interleaver/de-interleaver circuit connected between centralized queue circuit 320 and decoder memory 334.

Figure 4:
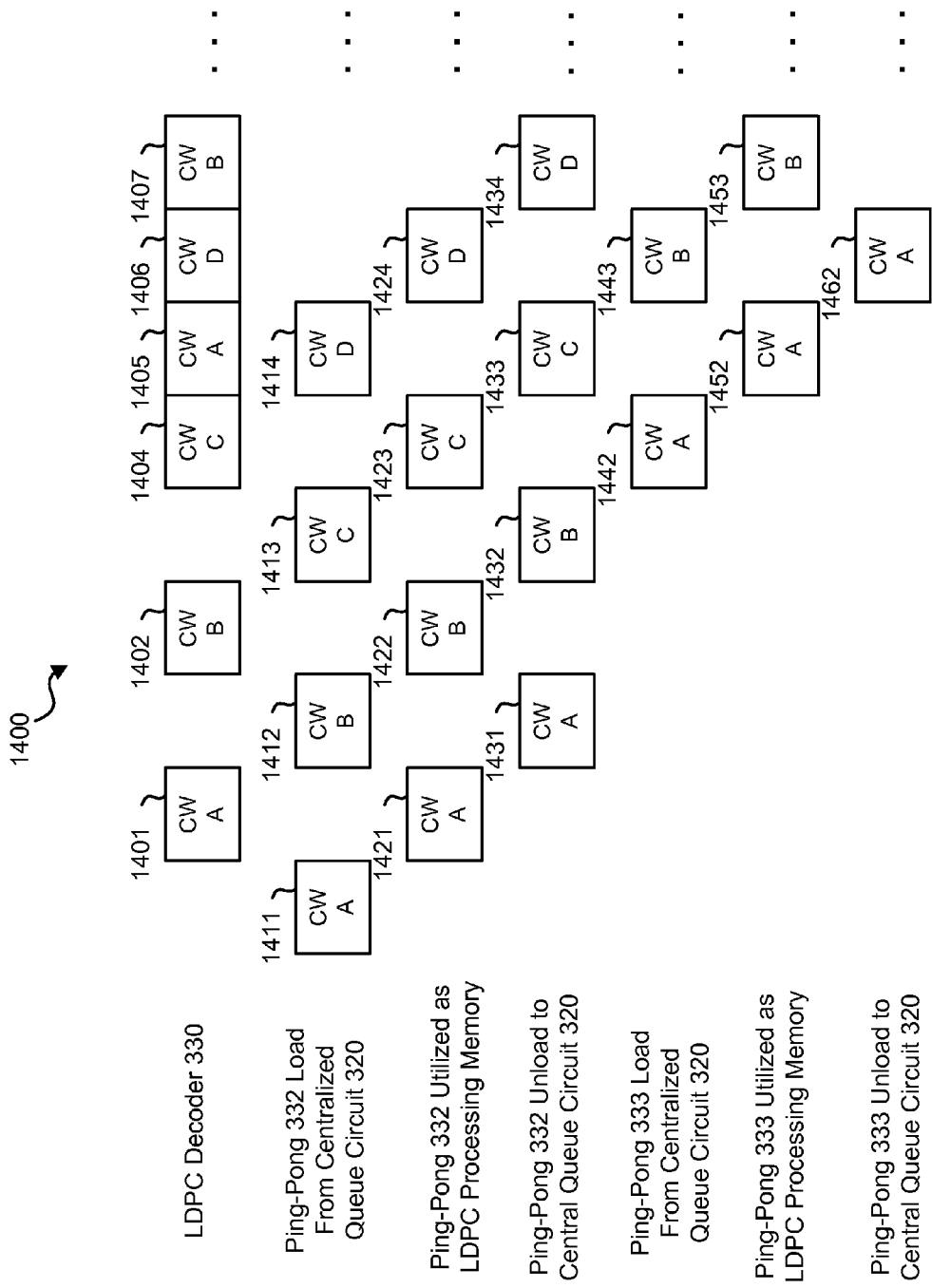
FIG. 4 is a timing diagram depicting scheduling of the decoder of the centralized memory queuing detection/decoding system of FIG. 3 in accordance with one or more embodiments of the present invention.

Turning to FIG. 4, a timing diagram 1400 depicts scheduling of decoder processing system 338 in accordance with one or more embodiments of the present invention. Following timing diagram 1400, a codeword A having been previously processed by channel detection processing circuit 308 and stored to centralized queue circuit 320 is loaded from centralized queue circuit 320 into ping-pong memory 332 during a time period (represented as block 1411). The data received from the channel detection processing circuit 308 and retrieved from centralized queue circuit 320 include the L messages as are known in the art. During a subsequent time period, LDPC decoder circuit 330 performs a decoding algorithm on codeword A (represented as block 1401) using ping-pong memory 332 as a processing memory (represented as block 1421). During the decoding process in LDPC decoder circuit 330, the L messages in ping-pong memory 332 are overwritten by Q messages internal to LDPC decoder circuit 330 as are known in the art. At the end of all of the local iterations through LDPC decoder circuit 330, the Q messages in ping-pong memory 332 are overwritten by P messages internal to LDPC decoder circuit 330 as are known in the art.

During the next period, the P messages of codeword A is unloaded from ping-pong memory 332 to centralized queue circuit 320 (represented as block 1431). During the same period, a codeword B (i.e., the L messages from the preceding data detection process) is loaded from centralized queue circuit 320 into ping-pong memory 332 (represented as block 1412). Such a concurrent loading and unloading process of ping-pong memory 332 relies on a write after read sequence where a subset of codeword A is transferred to centralized queue circuit and then immediately replaced in ping-pong memory 332 by a subset of codeword B read from centralized queue circuit 320. As such, a P messages resulting from the LDPC decoding is written to centralized queue circuit 320 and the same location is loaded from centralized queue circuit 320 with an L message resulting from the data detection. This process is repeated until ping-pong memory 332 is both unloaded of the P messages from one codeword and reloaded with the L messages for the next codeword.

It should be noted that decoder processing circuit 338 may operate on a component codeword level, rather than on a codeword level. As used herein, the term "codeword" is used in its broadest sense to refer to any data set that may be processed by a data processing system, and the phrase "component codeword" is used in its broadest sense to mean any subset of a codeword. In some cases, component codewords may be processed independent of other component codewords, and in other cases all component codewords associated with a codeword are processed together. As one example of a data processing circuit including a data decoder circuit and a data detection circuit, all component codewords of a codeword may be required to process through the data detection circuit and component codewords may be processable independently through the data decoding circuit. Based upon the disclosure provided herein, one of ordinary skill in the art will recognize a variety of other scenarios that may be supported in relation to different embodiments of the present invention. Further information on processing component codewords and codewords is discussed in U.S. patent application Ser. No. 12/785,413 entitled "Systems and Methods for Decoder Sharing Between Data Sets" and filed by Gunnam on a date even herewith. The aforementioned reference is incorporated herein by reference for all purposes.

During the next period, LDPC decoder circuit 330 performs the decoding algorithm on codeword B (represented as block 1402) using ping-pong memory 332 as a processing memory (represented as block 1422). Again, during the decoding process in LDPC decoder circuit 330, the L messages in ping-pong memory 332 are overwritten by Q messages internal to LDPC decoder circuit 330 as are known in the art. At the end of all of the local iterations through LDPC decoder circuit 330, the Q messages in ping-pong memory 332 are overwritten by P messages internal to LDPC decoder circuit 330 as are known in the art.

During a subsequent period, codeword B is unloaded from ping-pong memory 332 to centralized queue circuit 320 (represented as block 1432). During the same period, a codeword C is loaded from centralized queue circuit 320 into ping-pong memory 332 (represented as block 1413). Again, such a concurrent loading and unloading process of ping-pong memory 332 relies on a write after read sequence where a subset of codeword B is transferred to centralized queue circuit 320 and then immediately replaced in ping-pong memory 332 by a subset of codeword C read from centralized queue circuit 320. As such, P messages resulting from the LDPC decoding is written to centralized queue circuit 320 and the same location is loaded from centralized queue circuit 320 with an L message resulting from the data detection. This process is repeated until ping-pong memory 332 is both unloaded of the P messages from one codeword and reloaded with the L messages for the next codeword.

During the next period where the prior decoding of codeword A failed to converge, codeword A is loaded from centralized queue circuit 320 into ping-pong memory 333 (represented as block 1442). Concurrently, LDPC decoder circuit 330 performs the decoding algorithm on codeword C (represented as block 1404) using ping-pong memory 332 as a processing memory (represented as block 1423). During a subsequent period, codeword C is unloaded from ping-pong memory 332 to centralized queue circuit 320 (represented as block 1433). During the same period, a codeword D is loaded from centralized queue circuit 320 into ping-pong memory 332 (represented as block 1414). Again, such a concurrent loading and unloading process of ping-pong memory 332 relies on a write after read sequence where a subset of codeword C is transferred to centralized queue circuit and then immediately replaced in ping-pong memory 332 by a subset of codeword D read from centralized queue circuit 320. Concurrently, LDPC decoder circuit 330 performs the decoding algorithm on codeword A (represented as block 1405) using ping-pong memory 333 as a processing memory (represented as block 1452).

During the next period where the prior decoding of codeword B failed to converge, codeword B is loaded from centralized queue circuit 320 into ping-pong memory 333 (represented as block 1443). At the same time, codeword A is unloaded from ping-pong memory 333 to centralized queue circuit 320 (represented as block 1462). Again, such a concurrent loading and unloading process of ping-pong memory 333 relies on a write after read sequence where a subset of codeword B is transferred to centralized queue circuit 320 and then immediately replaced in ping-pong memory 333 by a subset of codeword A read from centralized queue circuit 320. Concurrently, LDPC decoder circuit 330 performs the decoding algorithm on codeword D (represented as block 1406) using ping-pong memory 332 as a processing memory (represented as block 1424).

During a subsequent period, codeword D is unloaded from ping-pong memory 332 to centralized queue circuit 320 (represented as block 1434). Concurrently, LDPC decoder circuit 330 performs the decoding algorithm on codeword B (represented as block 1407) using ping-pong memory 333 as a processing memory (represented as block 1453). The processing continues in the aforementioned manner until all available codewords have converged or timed out.

Figure 5:
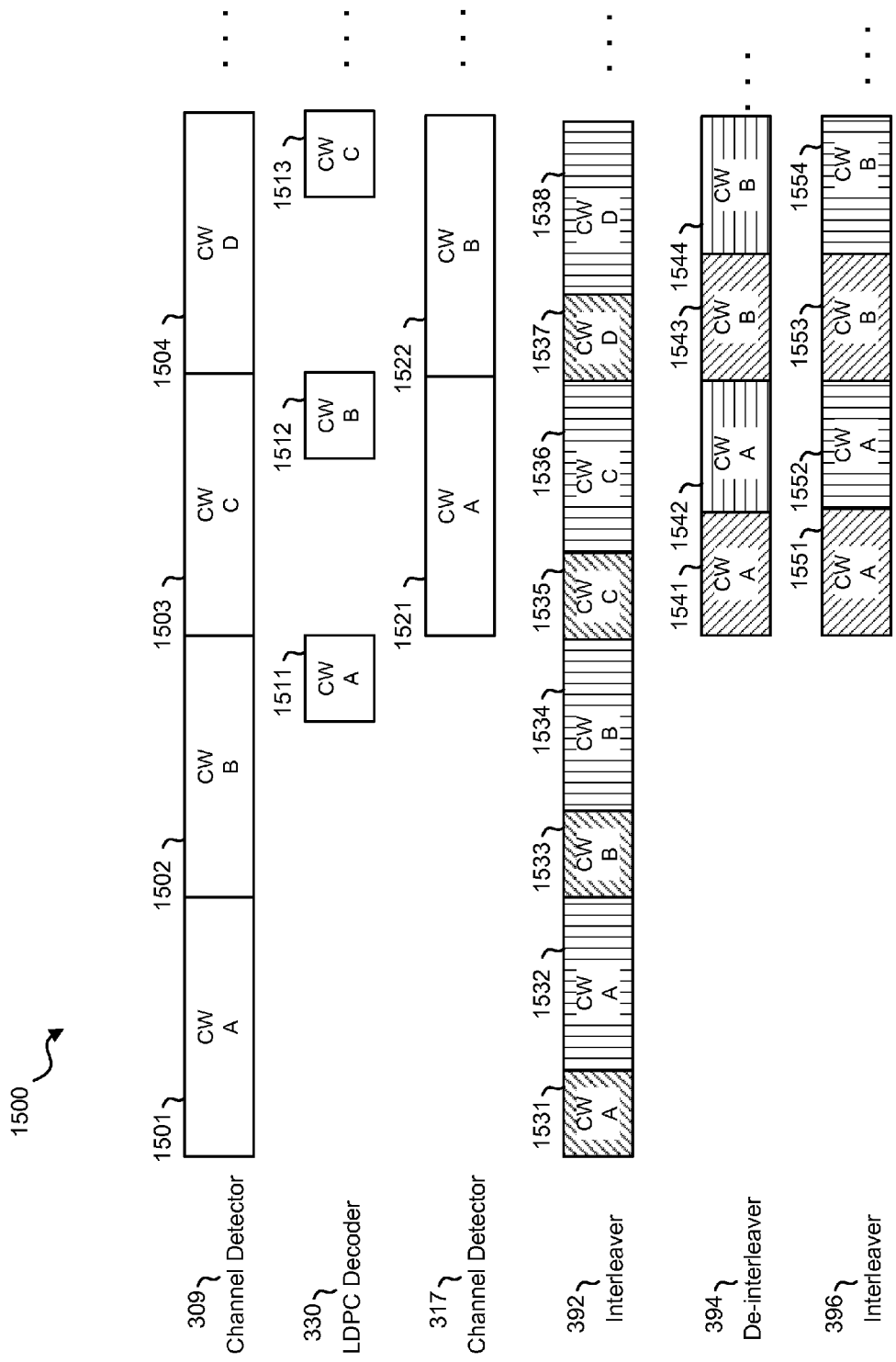
FIG. 5 is a timing diagram showing scheduling of the detection processing circuits and decoder processing circuit of the centralized memory queuing detection/decoding system of FIG. 3 in accordance with various embodiments of the present invention.

Turning to FIG. 5, a timing diagram 1500 shows scheduling of detection processing circuit 308, detection processing circuit 318 and decoder processing circuit 338 in accordance with various embodiments of the present invention. Following timing diagram 1500, during a period a codeword A is received and processed by channel detector circuit 309 (represented as block 1501). During the same period, local/global channel interleaver circuit 392 interleaves detected output 381. During an initial part of the period, detected output 381 is merely stored until sufficient detected data is received (represented as block 1531). Once sufficient data is received, the interleaving process begins to shuffle the data to reduce the effects of any localized noise (represented as block 1532). The interleaved codeword A is stored to centralized queue circuit 320.

Once the data detection and interleaving processes are complete for codeword A, a codeword B is introduced to detection processing circuit 308. Codeword B is received and processed by channel detector circuit 309 (represented as block 1502). During the same period, local/global channel interleaver circuit 392 interleaves detected output 381. During an initial part of the period, detected output 381 is merely stored until sufficient detected data is received (represented as block 1533). Once sufficient data is received, the interleaving process begins to shuffle the data to reduce the effects of any localized noise (represented as block 1534). The interleaved codeword B is stored to centralized queue circuit 320. While detection processing circuit 308 processes codeword B, codeword A is accessed from centralized queue circuit 320 and processed by decoder processing circuit 338 (represented as block 511). Where the decoding process does not result in convergence of codeword A, the result of the decoding process is stored in centralize queue circuit 320.

Once the data detection and interleaving processes are complete for codeword B, a codeword C is introduced to detection processing circuit 308. Codeword C is received and processed by channel detector circuit 309 (represented as block 1503). During the same period, local/global channel interleaver circuit 392 interleaves detected output 381. During an initial part of the period, detected output 381 is merely stored until sufficient detected data is received (represented as block 1535). Once sufficient data is received, the interleaving process begins to shuffle the data to reduce the effects of any localized noise (represented as block 1536). The interleaved codeword C is stored to centralized queue circuit 320.

While detection processing circuit 308 processes codeword C, codeword B is accessed from centralized queue circuit 320 and processed by decoder processing circuit 338 (represented as block 512). Where the decoding process does not result in convergence of codeword C, the result of the decoding process is stored in centralize queue circuit 320. Also at the same time that detection processing circuit 308 processes codeword C, previously unconverged codeword A is provided to channel detector circuit 317 via de-interleaver circuit 394. During an initial part of the period, codeword A from centralized queue circuit 320 is stored until sufficient detected data is received (represented as block 1541). Once sufficient data is received, the de-interleaving process begins reverse the process of the earlier interleaving (represented as block 1542). As detected data 383 is provided from channel detector circuit 317, interleaver circuit 396 interleaves the data to be written back to centralized queue circuit 320. During an initial part of the interleaving, detected output 383 is merely stored until sufficient detected data is received (represented as block 1551). Once sufficient data is received, the interleaving process begins to shuffle the data to reduce the effects of any localized noise (represented as block 1552).

Once the data detection and interleaving processes are complete for codeword C, a codeword D is introduced to detection processing circuit 308. Codeword D is received and processed by channel detector circuit 309 (represented as block 1504). During the same period, local/global channel interleaver circuit 392 interleaves detected output 381. During an initial part of the period, detected output 381 is merely stored until sufficient detected data is received (represented as block 1537). Once sufficient data is received, the interleaving process begins to shuffle the data to reduce the effects of any localized noise (represented as block 1538). The interleaved codeword D is stored to centralized queue circuit 320.

While detection processing circuit 308 processes codeword D, codeword C is accessed from centralized queue circuit 320 and processed by decoder processing circuit 338 (represented as block 513). Where the decoding process does not result in convergence of codeword C, the result of the decoding process is stored in centralize queue circuit 320. Also at the same time that detection processing circuit 308 processes codeword D, previously unconverged codeword B is provided to channel detector circuit 317 via de-interleaver circuit 394. During an initial part of the period, codeword B from centralized queue circuit 320 is stored until sufficient detected data is received (represented as block 1543). Once sufficient data is received, the de-interleaving process begins reverse the process of the earlier interleaving (represented as block 1544). As detected data 383 is provided from channel detector circuit 317, interleaver circuit 396 interleaves the data to be written back to centralized queue circuit 320. During an initial part of the interleaving, detected output 383 is merely stored until sufficient detected data is received (represented as block 1553). Once sufficient data is received, the interleaving process begins to shuffle the data to reduce the effects of any localized noise (represented as block 1554).

Figure 6:
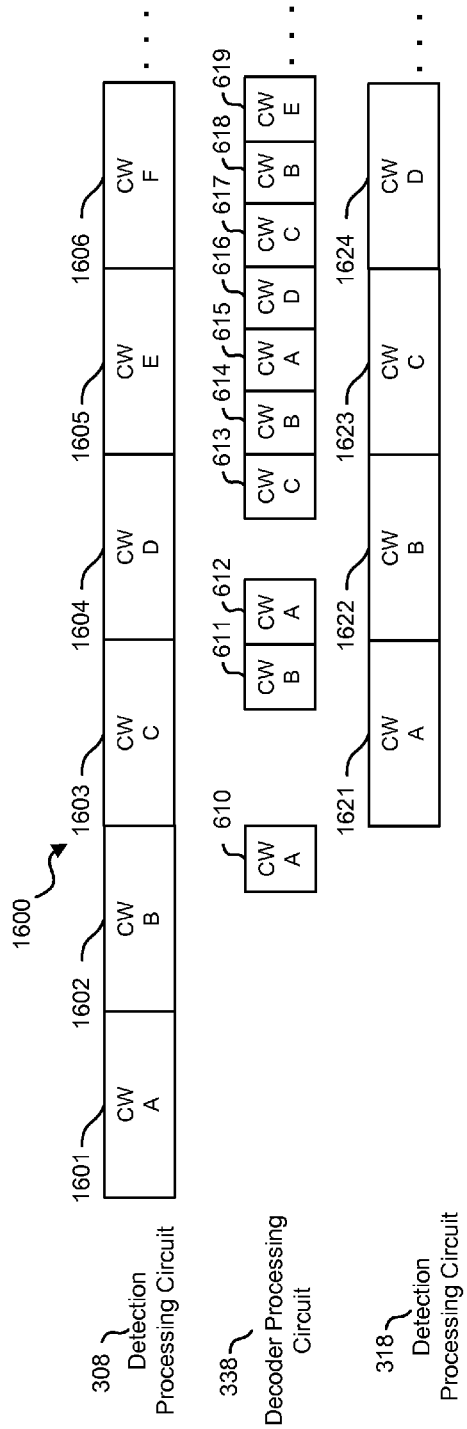
FIG. 6 is a timing diagram showing scheduling of the decoder and detectors of the centralized memory queuing detection/decoding system of FIG. 3 where three fixed global iterations are used along with a variable number of local iterations in accordance with some embodiments of the present invention.

Turning to FIG. 6, a timing diagram 1600 shows scheduling of decoder processing circuit 338 and detection processing circuits 308, 318 of centralized memory queuing detection/decoding system 301 where three fixed global iterations are used along with a variable number of local iterations in accordance with some embodiments of the present invention. Following timing diagram 1600, a codeword A is provided to detection processing circuit 308 via input 305 (represented as block 1601). Channel detector circuit 309 performs a detection algorithm on the received input and provides detected output 381 to local/global channel interleaver circuit 392. Local/global channel interleaver circuit 392 interleaves the detected output and writes the interleaved output to centralized queue circuit 320. A codeword B is provided to detection processing circuit 308 via input 305 (represented as block 1602). As with codeword A, channel detector circuit 309 performs a detection algorithm on the received input and provides detected output 381 to local/global channel interleaver circuit 392; and local/global channel interleaver circuit 392 interleaves the detected output and writes the interleaved output to centralized queue circuit 320. During the same time period (represented as block 1602), decoder processing circuit 338 accesses the interleaved codeword A from centralized queue circuit 320 and performs a decoding algorithm on the retrieved data (represented as block 610). Where codeword A fails to converge, the result of the decoding process is written back to centralize queue circuit 320.

A codeword C is provided to detection processing circuit 308 via input 305 (represented as block 1603). Channel detector circuit 309 performs a detection algorithm on the received input and provides detected output 381 to local/global channel interleaver circuit 392; and local/global channel interleaver circuit 392 interleaves the detected output and writes the interleaved output to centralized queue circuit 320. During the same time period (represented as block 1603), decoder processing circuit 338 accesses the interleaved codeword B from centralized queue circuit 320 and performs a decoding algorithm on the retrieved data (represented as block 611). Further, where codeword A failed to converge during the decoding process, codeword A is retrieved from centralized queue circuit 320 and processed by detection processing circuit 318 (represented as block 1621). The received data is de-interleaved by local/global channel de-interleaver circuit 394. The resulting de-interleaved output 382 is provided to channel detector circuit 317 where a detection algorithm is applied. The resulting detected output 383 from channel detector circuit 317 is provided to local/global channel interleaver circuit 396 that interleaves the input and provides it back to centralized queue circuit 320.

A codeword D is provided to detection processing circuit 308 via input 305 (represented as block 1604). Channel detector circuit 309 performs a detection algorithm on the received input and provides detected output 381 to local/global channel interleaver circuit 392; and local/global channel interleaver circuit 392 interleaves the detected output and writes the interleaved output to centralized queue circuit 320. During the same time period (represented as block 1604), decoder processing circuit 338 accesses the interleaved codeword A from centralized queue circuit 320 and performs a decoding algorithm on the retrieved data (represented as block 612); and subsequently decoder processing circuit 338 accesses the interleaved codeword C from centralized queue circuit 320 and performs a decoding algorithm on the retrieved data (represented as block 613). Further, where codeword B failed to converge during the decoding process, codeword B is retrieved from centralized queue circuit 320 and processed by detection processing circuit 318 (represented as block 1622). The received data is de-interleaved by local/global channel de-interleaver circuit 394. The resulting de-interleaved output 382 is provided to channel detector circuit 317 where a detection algorithm is applied. The resulting detected output 383 from channel detector circuit 317 is provided to local/global channel interleaver circuit 396 that interleaves the input and provides it back to centralized queue circuit 320.

A codeword E is provided to detection processing circuit 308 via input 305 (represented as block 1605). Channel detector circuit 309 performs a detection algorithm on the received input and provides detected output 381 to local/global channel interleaver circuit 392; and local/global channel interleaver circuit 392 interleaves the detected output and writes the interleaved output to centralized queue circuit 320. During the same time period (represented as block 1605), decoder processing circuit 338 accesses the interleaved codeword B from centralized queue circuit 320 and performs a decoding algorithm on the retrieved data (represented as block 614); subsequently decoder processing circuit 338 accesses the interleaved codeword A from centralized queue circuit 320 and performs a decoding algorithm on the retrieved data (represented as block 615); and subsequently decoder processing circuit 338 accesses the interleaved codeword D from centralized queue circuit 320 and performs a decoding algorithm on the retrieved data (represented as block 616). Further, where codeword C failed to converge during the decoding process, codeword C is retrieved from centralized queue circuit 320 and processed by detection processing circuit 318 (represented as block 1623). The received data is de-interleaved by local/global channel de-interleaver circuit 394. The resulting de-interleaved output 382 is provided to channel detector circuit 317 where a detection algorithm is applied. The resulting detected output 383 from channel detector circuit 317 is provided to local/global channel interleaver circuit 396 that interleaves the input and provides it back to centralized queue circuit 320.

A codeword F is provided to detection processing circuit 308 via input 305 (represented as block 1606). Channel detector circuit 309 performs a detection algorithm on the received input and provides detected output 381 to local/global channel interleaver circuit 392; and local/global channel interleaver circuit 392 interleaves the detected output and writes the interleaved output to centralized queue circuit 320. During the same time period (represented as block 1606), decoder processing circuit 338 accesses the interleaved codeword C from centralized queue circuit 320 and performs a decoding algorithm on the retrieved data (represented as block 617); subsequently decoder processing circuit 338 accesses the interleaved codeword B from centralized queue circuit 320 and performs a decoding algorithm on the retrieved data (represented as block 618); and subsequently decoder processing circuit 338 accesses the interleaved codeword E from centralized queue circuit 320 and performs a decoding algorithm on the retrieved data (represented as block 619). Further, where codeword D failed to converge during the decoding process, codeword D is retrieved from centralized queue circuit 320 and processed by detection processing circuit 318 (represented as block 1624). The received data is de-interleaved by local/global channel de-interleaver circuit 394. The resulting de-interleaved output 382 is provided to channel detector circuit 317 where a detection algorithm is applied. The resulting detected output 383 from channel detector circuit 317 is provided to local/global channel interleaver circuit 396 that interleaves the input and provides it back to centralized queue circuit 320.

Figure 7:
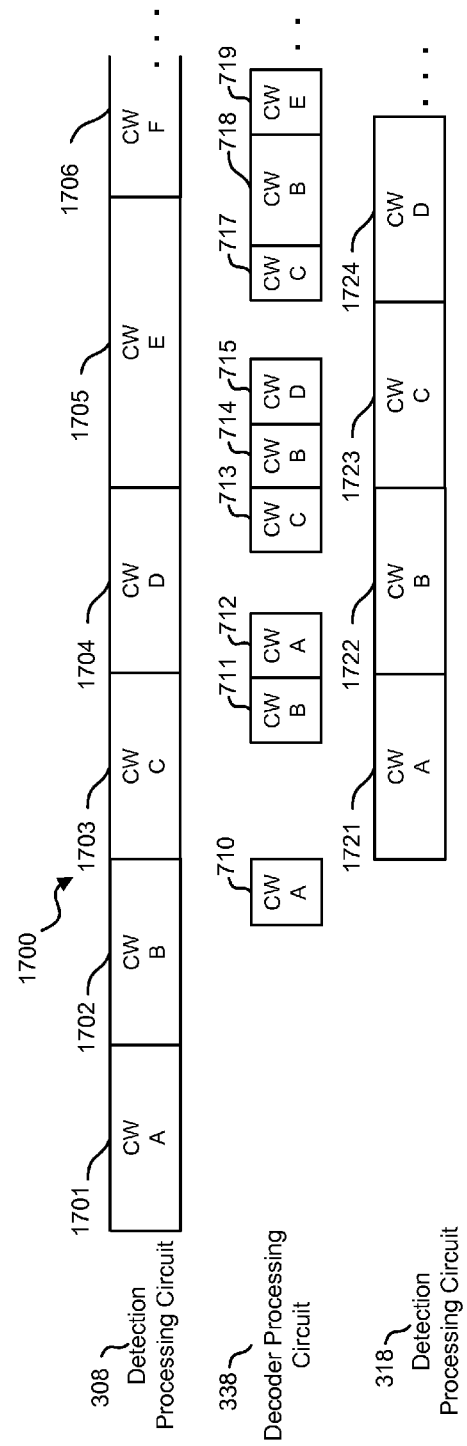
FIG. 7 is a timing diagram depicting scheduling of the decoder and detectors of the centralized memory queuing detection/decoding system of FIG. 3 where a variable number of global iterations and a fixed number of local iterations are used in accordance with some embodiments of the present invention.

Turning to FIG. 7, a timing diagram 700 depicts scheduling of decoder processing circuit 338 and detection processing circuits 308, 318 of centralized memory queuing detection/decoding system 301 where a variable number of global iterations and a fixed number of local iterations are used in accordance with some embodiments of the present invention. Following timing diagram 700, a codeword A is provided to detection processing circuit 308 via input 305 (represented as block 1701). Channel detector circuit 309 performs a detection algorithm on the received input and provides detected output 381 to local/global channel interleaver circuit 392. Local/global channel interleaver circuit 392 interleaves the detected output and writes the interleaved output to centralized queue circuit 320. A codeword B is provided to detection processing circuit 308 via input 305 (represented as block 1702). As with codeword A, channel detector circuit 309 performs a detection algorithm on the received input and provides detected output 381 to local/global channel interleaver circuit 392; and local/global channel interleaver circuit 392 interleaves the detected output and writes the interleaved output to centralized queue circuit 320. During the same time period (represented as block 1702), decoder processing circuit 338 accesses the interleaved codeword A from centralized queue circuit 320 and performs a decoding algorithm on the retrieved data (represented as block 710). Where codeword A fails to converge, the result of the decoding process is written back to centralize queue circuit 320.

A codeword C is provided to detection processing circuit 308 via input 305 (represented as block 1703). Channel detector circuit 309 performs a detection algorithm on the received input and provides detected output 381 to local/global channel interleaver circuit 392; and local/global channel interleaver circuit 392 interleaves the detected output and writes the interleaved output to centralized queue circuit 320. During the same time period (represented as block 1703), decoder processing circuit 338 accesses the interleaved codeword B from centralized queue circuit 320 and performs a decoding algorithm on the retrieved data (represented as block 711). Further, where codeword A failed to converge during the decoding process, codeword A is retrieved from centralized queue circuit 320 and processed by detection processing circuit 318 (represented as block 1721). The received data is de-interleaved by local/global channel de-interleaver circuit 394. The resulting de-interleaved output 382 is provided to channel detector circuit 317 where a detection algorithm is applied. The resulting detected output 383 from channel detector circuit 317 is provided to local/global channel interleaver circuit 396 that interleaves the input and provides it back to centralized queue circuit 320.

A codeword D is provided to detection processing circuit 308 via input 305 (represented as block 1704). Channel detector circuit 309 performs a detection algorithm on the received input and provides detected output 381 to local/global channel interleaver circuit 392; and local/global channel interleaver circuit 392 interleaves the detected output and writes the interleaved output to centralized queue circuit 320. During the same time period (represented as block 1704), decoder processing circuit 338 accesses the interleaved codeword A from centralized queue circuit 320 and performs a decoding algorithm on the retrieved data (represented as block 712); and subsequently decoder processing circuit 338 accesses the interleaved codeword C from centralized queue circuit 320 and performs a decoding algorithm on the retrieved data (represented as block 713). Further, where codeword B failed to converge during the decoding process, codeword B is retrieved from centralized queue circuit 320 and processed by detection processing circuit 318 (represented as block 1722). The received data is de-interleaved by local/global channel de-interleaver circuit 394. The resulting de-interleaved output 382 is provided to channel detector circuit 317 where a detection algorithm is applied. The resulting detected output 383 from channel detector circuit 317 is provided to local/global channel interleaver circuit 396 that interleaves the input and provides it back to centralized queue circuit 320.

A codeword E is provided to detection processing circuit 308 via input 305 (represented as block 1705). Channel detector circuit 309 performs a detection algorithm on the received input and provides detected output 381 to local/global channel interleaver circuit 392; and local/global channel interleaver circuit 392 interleaves the detected output and writes the interleaved output to centralized queue circuit 320. During the same time period (represented as block 1705), decoder processing circuit 338 accesses the interleaved codeword B from centralized queue circuit 320 and performs a decoding algorithm on the retrieved data (represented as block 714); and subsequently decoder processing circuit 338 accesses the interleaved codeword D from centralized queue circuit 320 and performs a decoding algorithm on the retrieved data (represented as block 715). Of note, the period for receiving codeword E via input 305 and performing the detection processes of detection processing circuit 308 is longer than other of the received codewords. As can be seen by comparing timing diagram 1700 with timing diagram 1600, this delay results in codeword C being accessed from centralized queue circuit 320 and processed by decoder processing circuit 338 during the period represented as block 1705 (represented as block 717), and codeword B being accessed from centralized queue circuit 320 before the end of the period represented as block 1705 (represented as block 718). However, as codeword E is not yet available in centralized queue circuit 320, further processing by decoder processing circuit 338 is delayed. Further, where codeword C failed to converge during the decoding process, codeword C is retrieved from centralized queue circuit 320 and processed by detection processing circuit 318 (represented as block 1723). Of note, this processing is done as soon as the result of the decoding process is available in centralize queue circuit 320. The received data is de-interleaved by local/global channel de-interleaver circuit 394. The resulting de-interleaved output 382 is provided to channel detector circuit 317 where a detection algorithm is applied. The resulting detected output 383 from channel detector circuit 317 is provided to local/global channel interleaver circuit 396 that interleaves the input and provides it back to centralized queue circuit 320. Also, beginning during the period represented as block 1705, codeword D is retrieved from centralized queue circuit 320 and processed by detection processing circuit 318 (represented as block 1724). Of note, this processing is done as soon as the result of the decoding process is available in centralize queue circuit 320. The received data is de-interleaved by local/global channel de-interleaver circuit 394. The resulting de-interleaved output 382 is provided to channel detector circuit 317 where a detection algorithm is applied. The resulting detected output 383 from channel detector circuit 317 is provided to local/global channel interleaver circuit 396 that interleaves the input and provides it back to centralized queue circuit 320.

A codeword F is provided to detection processing circuit 308 via input 305 (represented as block 1706). Channel detector circuit 309 performs a detection algorithm on the received input and provides detected output 381 to local/global channel interleaver circuit 392; and local/global channel interleaver circuit 392 interleaves the detected output and writes the interleaved output to centralized queue circuit 320. During the same time period (represented as block 1706), decoder processing circuit 338 finishes processing of codeword B (represented as block 718). Where codeword B fails to converge, the result of the decoding process is written back to centralized queue circuit 320. In addition, decoder processing circuit 338 retrieves codeword E from centralized queue circuit 320 and performs a decoding algorithm on the retrieved data (represented as block 719). Where codeword E fails to converge, the result of the decoding process is written back to centralized queue circuit 320.

Figure 8:
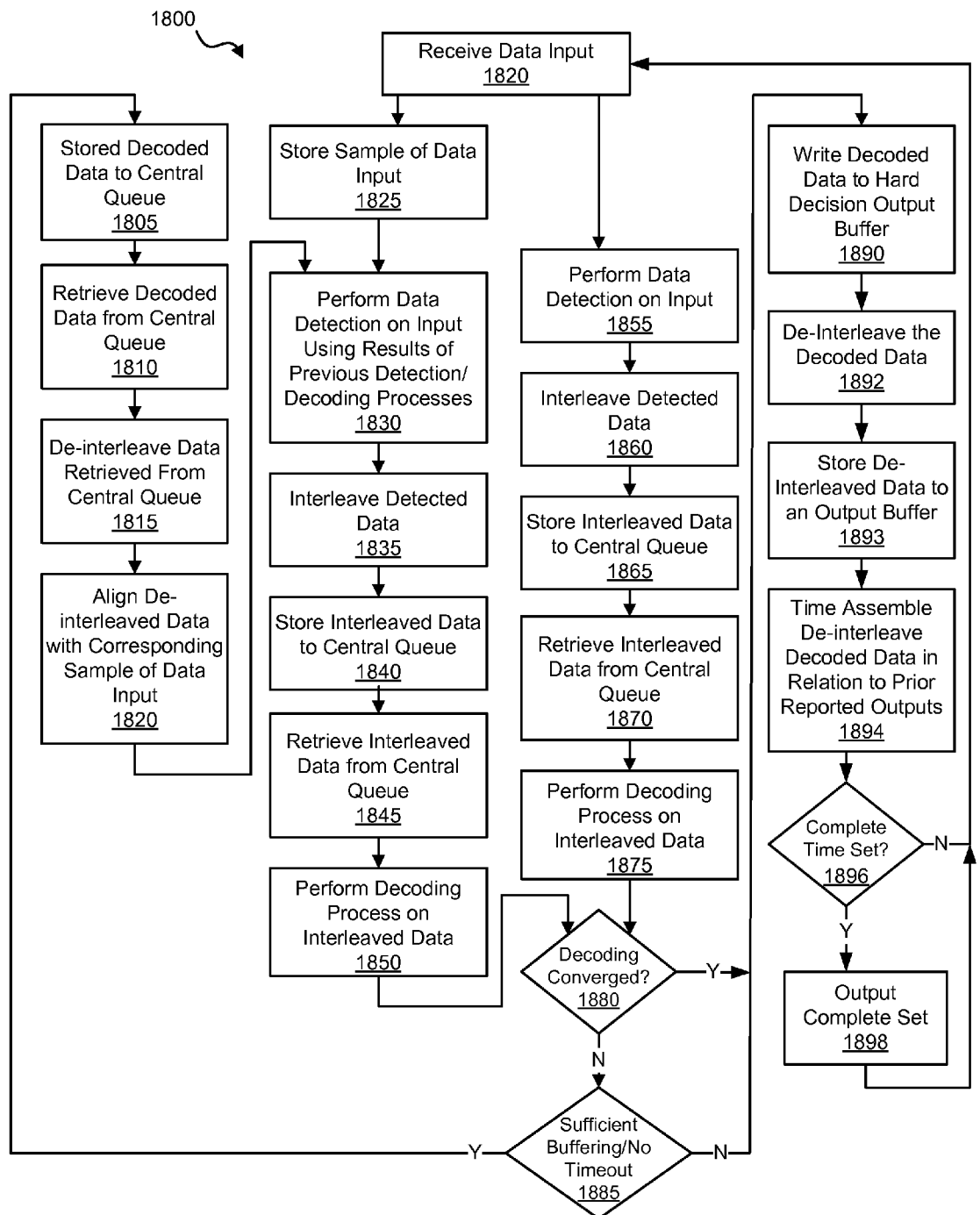
FIG. 8 is a flow diagram showing a method in accordance with some embodiments of the present invention for performing variable iterative detection and decoding processes.

Turning to FIG. 8, a flow diagram 1800 shows a method in accordance with some embodiments of the present invention for performing variable iterative detection and decoding processes. Following flow diagram 1800, a data input is received (block 1820). This data input may be, but is not limited to, a series of data bits received from a magnetic recording medium or a series of bits received from a transmission channel. Based on the disclosure provided herein, one of ordinary skill in the art will recognize a variety of sources and formats for the received data input. A sample of the received data is stored in a buffer and retained for later processing (block 1825). Data detection processes are performed on the received data (block 1855), the detected data is interleaved (block 1860), and the interleaved data is stored to a centralized queue circuit (block 1865).

Once the decoder circuit is available, the detected and interleaved data is retrieved from the centralized queue circuit (block 1870) and a decoding algorithm is applied to the retrieved data (block 1875). It is then determined whether the decoding process converged (block 1880). Where the decoding process failed to converged (block 1880), it is determined whether sufficient buffering is available to perform another global iteration (i.e., a detection and a decoding process) on the result of the decoding process and if the data corresponding to the result of the decoding process is not subject to a timeout condition (block 1885). Where no time out condition exists and there is sufficient buffered available (block 1885), another global iteration is performed in accordance with blocks 1805, 1810, 1815, 1820, 1830, 1835, 1840, 1845, 1850 as discussed below. Otherwise, where either the decoding process converged (block 1880) or there is insufficient buffering or a timeout condition has occurred (block 1885), the output of the decoding process is prepared for output as discussed below in relation to blocks 1890, 1892, 1893, 1894, 1896, 1898.

Where either the decoding process converged (block 1880) or there is insufficient buffering or a timeout condition has occurred (block 1885), the decoded data is stored to a hard decision output buffer (block 1890). The data is retrieved from the hard decision output buffer and de-interleaved (block 1892), and the de-interleaved data is stored to an output buffer (block 1893). The output buffer includes various results that may have become available out of order, and as such the various results are reordered in the buffer to represent the order in which the corresponding data input was originally received (block 1894). It is then determined if a complete time set is available in the buffer (block 1896). A complete time set includes every result corresponding to received inputs over a given period of time. Thus, for example, where the first result is delayed while two later results are reported, the complete time set exists for the three results once the first result is finally available in the buffer. It should be noted that in some embodiments of the present invention that the results are reported out of order to a recipient. In such cases, there is no need to reorder results or to determine whether complete time sets are available. Where a complete time set is available (block 1896) or where the results are to be reported as they are received without regard to order, the result(s) are output to a recipient (block 1898).

Alternatively, where no time out condition exists and there is sufficient buffered available (block 1885), the process of detection and decoding (i.e., a global iteration) is repeated. In particular, the decoded data is stored to the central queue circuit (block 1805). When the detection circuit is available, the decoded data is retrieved from the centralized queue circuit (block 1810), and the retrieved data is de-interleaved (block 1815). The de-interleaved data is then aligned with its corresponding original data set that was originally stored as a sample in block 1825 (block 1820). The de-interleaved data and the corresponding sample data input is provided to the data detector where a subsequent data detection is performed (block 1830) using the soft input developed in the earlier processing of the same data input (blocks 1855, 1860, 1865, 1870, 1875). The result of the data detection process is interleaved (block 1835) and the interleaved data is stored to the centralized queue circuit (block 1840). When the decoder is again available, the interleaved data is retrieved from the centralized queue circuit (block 1845), and the decoding process is applied to the retrieved data (block 1850). At this point, it is determined whether the data detection and decoding process is to be repeated (blocks 1805, 1810, 1815, 1820, 1830, 1835, 1840, 1845, 1850) or whether the result is to be reported (blocks 1890, 1892, 1893, 1894, 1896, 1898).

Figure 9A:
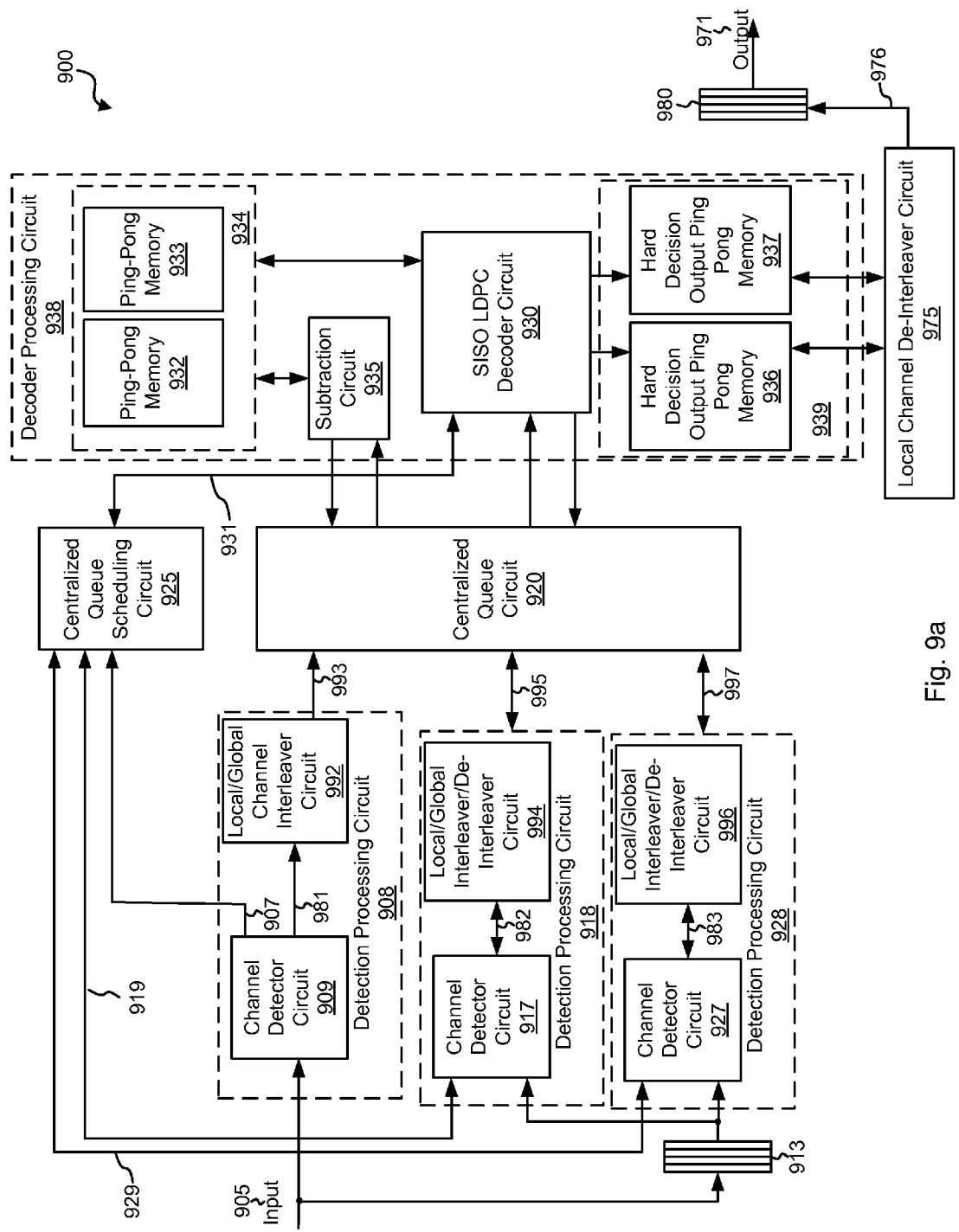
FIG. 9a shows another centralized memory queuing detection/decoding system in accordance with other embodiments of the present invention.

Turning to FIG. 9a, another centralized memory queuing detection/decoding system 900 is shown in accordance with other embodiments of the present invention. Centralized memory queuing detection/decoding circuit 900 includes a data input 905 that is fed to a detection processing circuit 908. Detection processing circuit 908 includes a channel detector circuit 909 and a local/global channel interleaver circuit 992. Channel detector circuit 909 may be any type of channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention. Local/global channel interleaver circuit 992 receives a detected output 981 from channel detector circuit 909 and performs an interleaving process on the received data. The interleaving process operates to shuffle the received data in accordance with a known algorithm to distribute any localized noise across a larger data set such that a later decoding process is less susceptible to failure due to high noise density areas of a received codeword. Based upon the disclosure provided herein, one of ordinary skill in the art will recognize a variety of shuffle or interleaving algorithms that may be used in relation to various embodiments of the present invention. An interleaved output 993 is provided to a centralized queue circuit 920. It should be noted that in some embodiments of the present invention detection processing circuit 908 includes only channel detector circuit 909. In such cases, detected output 981 is provided directly to a centralized queue circuit 920. A processing status signal 907 of channel detector circuit 909 is provided to a centralized queue scheduling circuit 925. In some cases, processing status signal 907 indicates a completion of processing of a data set provided as data input 905 (i.e., the availability of the completed data set in centralized queue circuit 920).

In addition, data input 905 is provided to a memory buffer 913 that is designed to hold a number of data sets received from data input 905. The size of memory buffer 913 may be selected to provide sufficient buffering such that a data set received via data input 905 remains available at least until a first iteration processing of that same data set is complete and the processed data is available in centralized queue circuit 920 as more fully described below. Memory buffer 913 provides the data sets to a detection processing circuit 918. Detection processing circuit 918 includes a channel detector circuit 917 and a local/global channel interleaver/de-interleaver circuit 394. Channel detector circuit 917 may be any type of channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention.

Local/global channel interleaver/de-interleaver circuit 994 receives a detected output via a connection 982 from channel detector circuit 317 and performs an interleaving process on the received data. Similar to that described above in relation to local/global channel interleaver circuit 992, the interleaving process operates to shuffle the received data in accordance with a known algorithm to distribute any localized noise across a larger data set such that a later decoding process is less susceptible to failure due to high noise density areas of a received codeword. Based upon the disclosure provided herein, one of ordinary skill in the art will recognize a variety of shuffle algorithms that may be used in relation to various embodiments of the present invention. An interleaved output is provided via a connection 995 to centralized queue circuit 920.

In addition, local/global channel interleaver/de-interleaver circuit 994 receives an interleaved data set via connection 995 from centralized queue circuit 920. Local/global channel interleaver/de-interleaver circuit 994 reverses the shuffling that was earlier applied by any of a local/global channel interleaver/de-interleaver circuit 996, local/global channel interleaver/de-interleaver circuit 994, or local/global channel interleaver circuit 992. Local/global channel interleaver/de-interleaver circuit 994 provides a de-interleaved output via connection 982 to channel detector circuit 917. Based on the disclosure provided herein, one of ordinary skill in the art will recognize a variety of de-interleaving approaches that may be used in relation to different embodiments of the present invention.

A processing status signal 919 is provided between centralized queue scheduling circuit 925 and channel detector circuit 917. In some cases, processing status signal 919 indicates a completion of processing of a data set when one signal of processing status signal 919 is asserted by channel detector circuit 917, and authorization to begin accessing a data set from centralized queue circuit 920 is indicated when centralized queue scheduling circuit 925 asserts another signal in processing status signal 919.

Data from memory buffer 913 is also provided to a detection processing circuit 928 that includes a channel detector circuit 927 and local/global channel interleaver/de-interleaver circuit 996. Channel detector circuit 927 may be any type of channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention.

Local/global channel interleaver/de-interleaver circuit 996 receives a detected output via a connection 983 from channel detector circuit 927 and performs an interleaving process on the received data. Similar to that described above in relation to local/global channel interleaver circuit 992, the interleaving process operates to shuffle the received data in accordance with a known algorithm to distribute any localized noise across a larger data set such that a later decoding process is less susceptible to failure due to high noise density areas of a received codeword. Based upon the disclosure provided herein, one of ordinary skill in the art will recognize a variety of shuffle algorithms that may be used in relation to various embodiments of the present invention. An interleaved output is provided via a connection 997 to centralized queue circuit 920.

In addition, local/global channel interleaver/de-interleaver circuit 996 receives an interleaved data set via connection 997 from centralized queue circuit 920. Local/global channel interleaver/de-interleaver circuit 994 reverses the shuffling that was earlier applied by any of a local/global channel interleaver/de-interleaver circuit 996, local/global channel interleaver/de-interleaver circuit 994, or local/global channel interleaver circuit 992. Local/global channel interleaver/de-interleaver circuit 996 provides a de-interleaved output via connection 983 to channel detector circuit 927. Based on the disclosure provided herein, one of ordinary skill in the art will recognize a variety of de-interleaving approaches that may be used in relation to different embodiments of the present invention.

A processing status signal 929 is provided between centralized queue scheduling circuit 925 and channel detector circuit 927. In some cases, processing status signal 929 indicates a completion of processing of a data set when one signal of processing status signal 929 is asserted by channel detector circuit 927, and authorization to begin accessing a data set from centralized queue circuit 920 is indicated when centralized queue scheduling circuit 925 asserts another signal in processing status signal 929.

Centralized queue circuit 920 is a storage circuit capable of maintaining data sets provided by detection processing circuit 908, data sets provided by detection processing circuit 918, and data sets provided by a decoder processing circuit 938. In some cases, centralized queue circuit 920 is a dual port memory allowing accesses by two requestors at a time. In other cases, centralized queue circuit 920 is a single port memory allowing accesses by only one requestor at a time. In various cases, a write after read access is used to increase the memory usage of a single port implementation. Write after read permits the sharing of same memory space allocated for a codeword by another codeword. In essence, memory allocated for the incoming codeword at the memory row level as the out going codeword is vacating the space occupied a memory row.

Data sets previously processed by detection processing circuit 908, detection processing circuit 918, or detection processing circuit 928 are decoded by decoder processing circuit 938. Decoder processing circuit 938 includes a soft input/soft output (SISO) low density parity check (LDPC) decoder circuit 930, a decoder memory circuit 934 and a decoder memory circuit 939. Decoder memory circuit 934 includes a ping-pong memory 932 and a ping-pong memory 933. Decoder memory circuit 939 includes a ping-pong memory 936 and a ping-pong memory 937. In operation, decoder processing circuit 938 loads data provided from centralized queue circuit 920 into one of ping-pong memory 932 or ping-pong memory 933. At the same time, LDPC decoder circuit 930 applies a data decoding algorithm to the data set maintained in ping-pong memory 933. During the decoding process, LDPC decoder circuit 930 uses ping-pong memory 933 as a processing memory. Where the decoding process fails to converge, decoder processing circuit 938 writes the decoded data set from ping-pong memory 933 to centralized queue circuit 920 via a subtraction circuit 935. Subtraction circuit 935 pulls the L messages previously written to centralized queue circuit 920 by one of the data detection processing circuits 908, 918, 928 and subtracts the corresponding P messages generated by LDPC decoder circuit 930 to yield the extrinsic values (i.e., the E messages). The resulting E messages are written back to centralized queue circuit 920 as ping-pong memory 933 is unloaded. Concurrently, LDPC decoder circuit 930 applies a data decoding algorithm to the data set previously loaded into ping-pong memory 932. During this processing, LDPC decoder circuit 930 uses ping-pong memory 932 as a processing memory.

In one particular embodiment of the present invention, LDPC decoder circuit 930 is operable to perform a total of fifteen local iterations (i.e., a pass through LDPC decoder circuit 930) spread across three global iterations (i.e., a pass through one or detection processing circuits 908, 918, 928 and LDPC decoder circuit 930). In such a case, each of detection processing circuits 908, 918, 928 and decoder processing circuit 938 are operating on a distinct data sets at any given time allowing for processing in each to be performed without interaction with the other. In some cases, each of detection processing circuits 908, 918, 928 processes four samples per clock cycle.

Alternatively, where the processing of the data set maintained in ping-pong memory 933 converges, the converged data is written out to one of hard decision ping-pong memory 936 or hard decision ping-pong memory 937. Concurrently, any converged data set maintained in the other of hard decision ping-pong memory 936 or hard decision ping-pong memory 937 is unloaded to a local channel de-interleaver circuit 975. Local channel de-interleaver circuit 975 reverses the shuffling that was applied by any of a local/global channel interleaver/de-interleaver circuit 996, local/global channel interleaver/de-interleaver circuit 994, or local/global channel interleaver circuit 992. The resulting de-interleaved data set 976 is written to one buffer area of an output buffer 980.

Centralized memory queuing detection/decoding circuit 900 allows for performance of a variable number of detection and decoding iterations depending upon the introduced data. Further, in some cases, considerable power savings may be achieved through use of centralized memory queuing detection/decoding circuit 900. Yet further, in some cases, a faster LDPC decoder may be implemented allowing for an increased throughput where substantial first iteration data convergence exists as multiple iterations are not necessarily required. Yet further, by allowing results of LDPC decoder circuit 930 to be reported out of order via decoder memory circuit 939, upstream processing does not have to wait for the completion of downstream processing. Re-ordering of the out of order results may be done by centralized memory queuing detection/decoding circuit 900 or by a downstream recipient of an output 971.

A processing status signal 931 is provided between decoder processing circuit 938 and centralized queue scheduling circuit 925. In some cases, processing status signal 931 indicates a completion of processing of a data set when one signal of processing status signal 931 is asserted by decoder processing circuit 938, and authorization to begin accessing a data set from centralized queue circuit 920 is indicated when centralized queue scheduling circuit 925 asserts another signal in processing status signal 931.

Centralized queue scheduling circuit 925 is responsible for controlling access into and out of centralized queue circuit 920, and for directing the data to be processed by detection processing circuit 918, detection processing circuit 928, and decoder processing circuit 938 during any given time increment. As such, processing status signal 931 provides an indication of which data is to be accessed by decoder processing circuit 938 when access to centralized queue circuit 920 is granted, processing status signal 919 provides an indication of which data is to be accessed by detection processing circuit 918 when access to centralized queue circuit 920 is granted, and processing status signal 929 provides an indication of which data is to be accessed by detection processing circuit 928 when access to centralized queue circuit 920 is granted. When centralized queue scheduling circuit 925 indicates via processing status signal 919 that access is available into centralized queue circuit 920 by detection processing circuit 918, it also indicates the previously decoded data set that is to be retrieved from centralized queue circuit 920. Similarly, when centralized queue scheduling circuit 925 indicates via processing status signal 929 that access is available into centralized queue circuit 920 by detection processing circuit 928, it also indicates the previously decoded data set that is to be retrieved from centralized queue circuit 920. In addition, when centralized queue scheduling circuit 925 indicates via processing status signal 931 that access is available into centralized queue circuit by decoder processing circuit 938, it also indicates the previously detected data set that is to be retrieved from centralized queue circuit 920.

Centralized queue scheduling circuit 925 determines what data is to be processed next based upon various quality metrics generated by decoder processing circuit 938. Such quality metrics may include, but are not limited to, a number of remaining errors in a given data set. As an example, where a data set is very close to converging (i.e., it has only limited remaining errors) it may be selected to go before another data set under a theory that the data set will finish on the next pass. Alternatively, a data set that is nearing a timeout condition may be selected to be processed earlier than one having a large amount of time remaining. As yet another alternative, a data set may be selected based on nearing a maximum latency threshold dictated by the depth of output buffer 980. Based upon the disclosure provided herein, one of ordinary skill in the art will recognize a variety of metrics and corresponding scheduling criteria that may be used in relation to different embodiments of the present invention. In one particular embodiment of the present invention, all of the data sets traversing centralized memory queuing detection/decoding system 900 may be preempted such that processing proceeds in accordance with the quality metrics utilized by centralized queue scheduling circuit 925 to provide process ordering.

It should be noted that the timing diagrams of FIG. 4 and FIG. 5 also describe the operation of centralized memory queuing detection/decoding system 900. In particular, timing diagram 1400 depicts scheduling of decoder processing circuit 938 of centralized memory queuing detection/decoding system 900. To apply timing diagram 1400 to centralized memory queuing detection/decoding system 900, LDPC decoder 330 is changed to LDPC decoder 930, pin-pong 332 is changed to ping-pong 932, centralized queue circuit 320 is changed to centralized queue circuit 920, and pin-pong 333 is changed to ping-pong 933. Timing diagram 1500 shows scheduling of the detection processing circuits and the decoder processing circuit of the centralized memory queuing detection/decoding system 900. To apply timing diagram 1500 to centralized memory queuing detection/decoding system 900, channel detector 309 is changed to channel detector 909, LDPC decoder 330 is changed to LDPC decoder 930, channel detector 317 is changed to channel detector 917, interleaver 392 is changed to interleaver 992, and de-interleaver 394 and interleaver 396 are changed to local/global channel interleaver/de-interleaver circuit 994.

It should be noted that in different embodiments of the present invention that various of the circuits in centralized memory queuing detection/decoding system 900 may be interconnected in different ways. For example, local channel de-interleaver circuit 975 may be connected between output buffer 980 and output 971 with the outputs from decoder memory 939 provided directly to output buffer 980. As another example, the local de-interleaver portion of local/global channel de-interleaver circuit 994 may be connected between channel detector circuit 917 and centralized queue circuit 920 and the local interleaver portion of local/global channel interleaver circuit 996 may be connected between channel detector circuit 917 and centralized queue circuit 920 with the global de-interleaver portion of local/global channel de-interleaver circuit 994 and the global interleaver portion of local/global channel interleaver circuit 996 being implemented between centralized queue circuit 920 and decoder memory 934. As yet another example, all of local/global channel de-interleaver circuit 994, local/global channel interleaver circuit 996 and portion of local interleaver circuit 992 may be implemented as a combined interleaver/de-interleaver circuit connected between centralized queue circuit 920 and decoder memory 934.

Figure 9B:
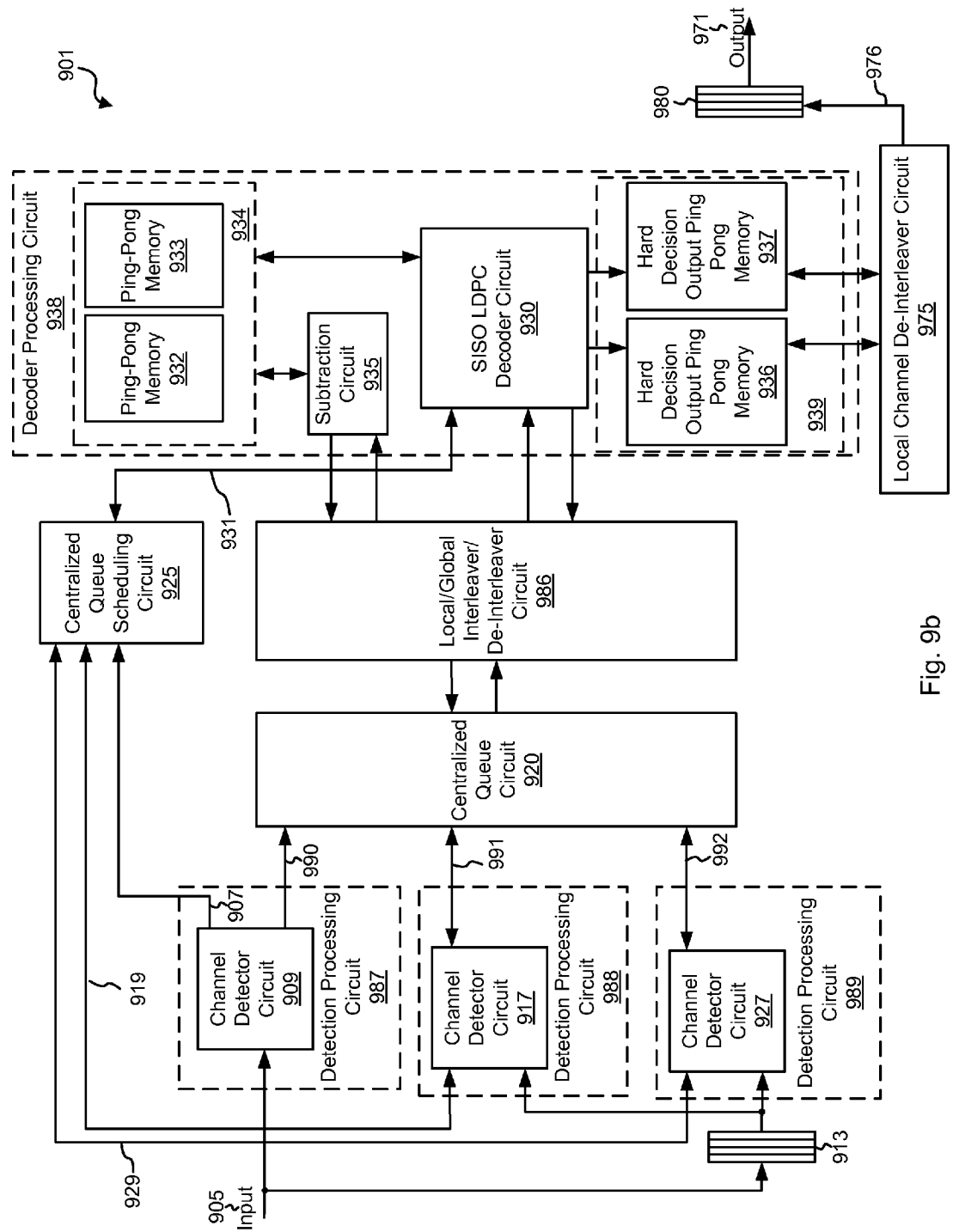
FIG. 9b shows yet another centralized memory queuing detection/decoding system in accordance with other embodiments of the present invention.

Turning to FIG. 9b, yet another centralized memory queuing detection/decoding system 901 is shown in accordance with one or more embodiments of the present invention. Centralized memory queuing detection/decoding circuit 901 is substantially the same as centralized memory queuing detection/decoding circuit 901 except that global/local interleaving and de-interleaving is implemented between centralized queue circuit 920 and decoder processing circuit 938. As such, detection processing circuit 908 of centralized memory queuing detection/decoding circuit 900 is replaced with detection processing circuit 987 to remove the local channel interleaver circuit with a channel detector circuit 909 directly coupled to centralized queue circuit 920 via an output 990. Similarly, detection processing circuit 918 of centralized memory queuing detection/decoding circuit 900 is replaced with detection processing circuit 988 to remove the local/global channel interleaver circuit with a channel detector circuit 917 directly coupled to centralized queue circuit 920 via an input/output 991; and detection processing circuit 928 of centralized memory queuing detection/decoding circuit 900 is replaced with detection processing circuit 989 to remove the local/global channel interleaver circuit with a channel detector circuit 927 directly coupled to centralized queue circuit 920 via an input/output 992. Data received from decoder processing circuit 938 directed to centralized queue circuit 920 are de-interleaved by a local/global interleaver/de-interleaver circuit 986. The de-interleaved data is stored to centralized queue circuit 920 in preparation for processing by one of detection processing circuit 988 or detection processing circuit 989. Data provided from centralized queue circuit 920 to decoder processing circuit 938 is interleaved by local/global interleaver/de-interleaver circuit 986 before the data is written to decoder memory circuit 934.

Figure 10:
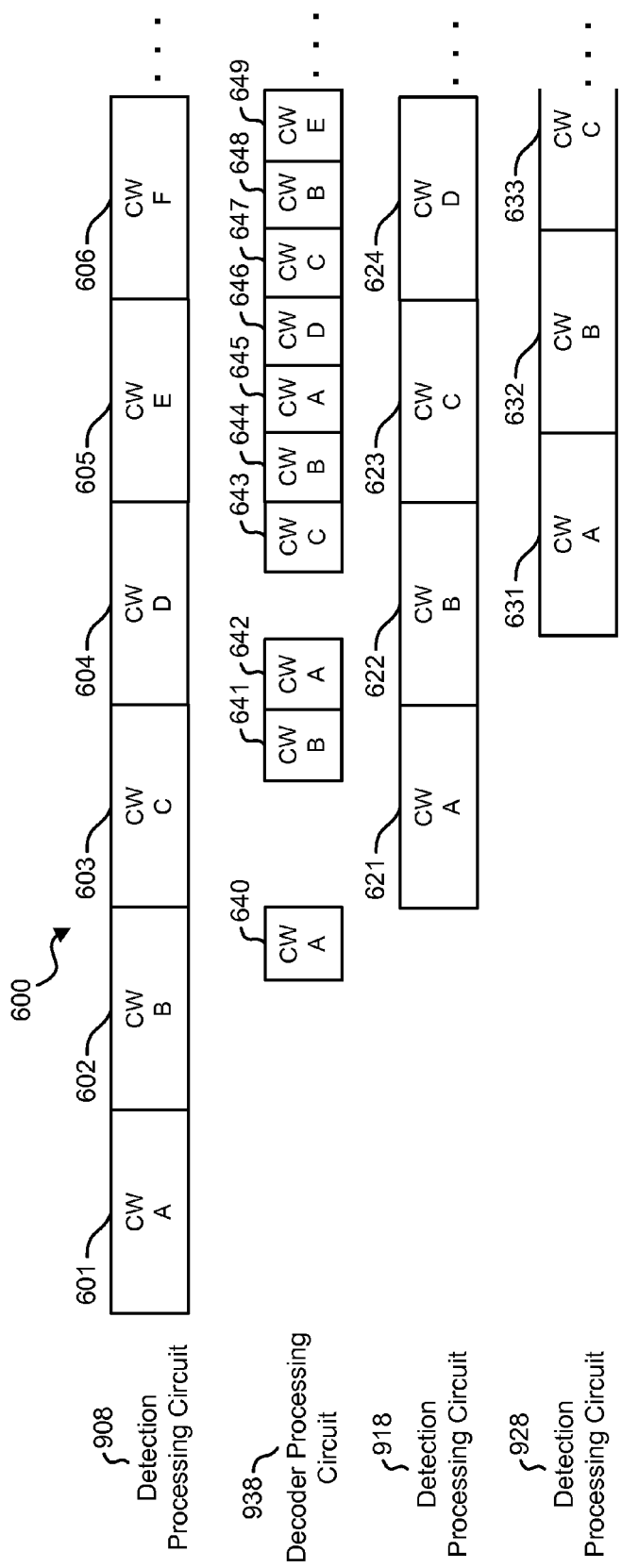
FIG. 10 is a timing diagram showing scheduling of the decoder and detectors of the centralized memory queuing detection/decoding system of FIG. 9 where three fixed global iterations are used along with five fixed local iterations in accordance with one or more embodiments of the present invention.

Turning to FIG. 10, a timing diagram 600 shows scheduling of decoder processing circuit 938 and detection processing circuits 908, 918, 928 centralized memory queuing detection/decoding system 900 where three fixed global iterations are used along with five fixed local iterations in accordance with one or more embodiments of the present invention. Following timing diagram 600, a codeword A is provided to detection processing circuit 908 via input 905 (represented as block 601). Channel detector circuit 909 performs a detection algorithm on the received input and provides detected output 981 to local/global channel interleaver circuit 992. Local/global channel interleaver circuit 992 interleaves the detected output and writes the interleaved output to centralized queue circuit 920. A codeword B is provided to detection processing circuit 908 via input 905 (represented as block 602). As with codeword A, channel detector circuit 909 performs a detection algorithm on the received input and provides detected output 981 to local/global channel interleaver circuit 992; and local/global channel interleaver circuit 992 interleaves the detected output and writes the interleaved output to centralized queue circuit 920. During the same time period (represented as block 602), decoder processing circuit 938 accesses the interleaved codeword A from centralized queue circuit 920 and performs a decoding algorithm on the retrieved data (represented as block 640). Where codeword A fails to converge, the result of the decoding process is written back to centralize queue circuit 920.

A codeword C is provided to detection processing circuit 908 via input 905 (represented as block 603). Channel detector circuit 909 performs a detection algorithm on the received input and provides detected output 981 to local/global channel interleaver circuit 992; and local/global channel interleaver circuit 992 interleaves the detected output and writes the interleaved output to centralized queue circuit 920. During the same time period (represented as block 603), decoder processing circuit 938 accesses the interleaved codeword B from centralized queue circuit 920 and performs a decoding algorithm on the retrieved data (represented as block 641). Further, where codeword A failed to converge during the decoding process, codeword A is retrieved from centralized queue circuit 920 and processed by detection processing circuit 918 (represented as block 621). The received data is de-interleaved by local/global channel interleaver/de-interleaver circuit 994. The resulting de-interleaved output is provided to channel detector circuit 917 via connection 982 where a detection algorithm is applied. The resulting detected output from detector circuit 917 is provided to local/global channel interleaver/de-interleaver circuit 994 via connection 982 where it is interleaved. The interleaved result is provided back to centralized queue circuit 920.

A codeword D is provided to detection processing circuit 908 via input 905 (represented as block 604). Channel detector circuit 909 performs a detection algorithm on the received input and provides detected output 981 to local/global channel interleaver circuit 992; and local/global channel interleaver circuit 992 interleaves the detected output and writes the interleaved output to centralized queue circuit 920. During the same time period (represented as block 604), decoder processing circuit 938 accesses the interleaved codeword A from centralized queue circuit 920 and performs a decoding algorithm on the retrieved data (represented as block 642); and subsequently decoder processing circuit 938 accesses the interleaved codeword C from centralized queue circuit 920 and performs a decoding algorithm on the retrieved data (represented as block 643). Further, where codeword B failed to converge during the decoding process, codeword B is retrieved from centralized queue circuit 920 and processed by detection processing circuit 918 (represented as block 622). The received data is de-interleaved by local/global channel interleaver/de-interleaver circuit 994. The resulting de-interleaved output is provided to channel detector circuit 917 via connection 982 where a detection algorithm is applied. The resulting detected output from detector circuit 917 is provided to local/global channel interleaver/de-interleaver circuit 994 via connection 982 where it is interleaved. The interleaved result is provided back to centralized queue circuit 920. Overlapping the same period (represented as block 604), where codeword A failed to converge during the decoding process, codeword A is retrieved from centralized queue circuit 920 and processed by detection processing circuit 928 (represented as block 631). The received data is de-interleaved by local/global channel interleaver/de-interleaver circuit 996. The resulting de-interleaved output is provided to channel detector circuit 927 via connection 983 where a detection algorithm is applied. The resulting detected output from detector circuit 927 is provided to local/global channel interleaver/de-interleaver circuit 996 via connection 983 where it is interleaved. The interleaved result is provided back to centralized queue circuit 920.

A codeword E is provided to detection processing circuit 908 via input 905 (represented as block 605). Channel detector circuit 909 performs a detection algorithm on the received input and provides detected output 981 to local/global channel interleaver circuit 992; and local/global channel interleaver circuit 992 interleaves the detected output and writes the interleaved output to centralized queue circuit 920. During the same time period (represented as block 605), decoder processing circuit 938 accesses the interleaved codeword B from centralized queue circuit 920 and performs a decoding algorithm on the retrieved data (represented as block 644); subsequently decoder processing circuit 938 accesses the interleaved codeword A from centralized queue circuit 920 and performs a decoding algorithm on the retrieved data (represented as block 645); and subsequently decoder processing circuit 938 accesses the interleaved codeword D from centralized queue circuit 920 and performs a decoding algorithm on the retrieved data (represented as block 646). Further, where codeword C failed to converge during the decoding process, codeword C is retrieved from centralized queue circuit 920 and processed by detection processing circuit 918 (represented as block 623). The received data is de-interleaved by local/global channel interleaver/de-interleaver circuit 994. The resulting de-interleaved output is provided to channel detector circuit 917 via connection 982 where a detection algorithm is applied. The resulting detected output from detector circuit 917 is provided to local/global channel interleaver/de-interleaver circuit 994 via connection 982 where it is interleaved. The interleaved result is provided back to centralized queue circuit 920. Overlapping the same period (represented as block 605), where codeword B failed to converge during the decoding process, codeword B is retrieved from centralized queue circuit 920 and processed by detection processing circuit 928 (represented as block 632). The received data is de-interleaved by local/global channel interleaver/de-interleaver circuit 996. The resulting de-interleaved output is provided to channel detector circuit 927 via connection 983 where a detection algorithm is applied. The resulting detected output from detector circuit 927 is provided to local/global channel interleaver/de-interleaver circuit 996 via connection 983 where it is interleaved. The interleaved result is provided back to centralized queue circuit 920.

A codeword F is provided to detection processing circuit 908 via input 905 (represented as block 606). Channel detector circuit 909 performs a detection algorithm on the received input and provides detected output 981 to local/global channel interleaver circuit 992; and local/global channel interleaver circuit 992 interleaves the detected output and writes the interleaved output to centralized queue circuit 920. During the same time period (represented as block 606), decoder processing circuit 938 accesses the interleaved codeword C from centralized queue circuit 920 and performs a decoding algorithm on the retrieved data (represented as block 647); subsequently decoder processing circuit 938 accesses the interleaved codeword B from centralized queue circuit 920 and performs a decoding algorithm on the retrieved data (represented as block 648); and subsequently decoder processing circuit 938 accesses the interleaved codeword E from centralized queue circuit 920 and performs a decoding algorithm on the retrieved data (represented as block 649). Further, where codeword D failed to converge during the decoding process, codeword D is retrieved from centralized queue circuit 920 and processed by detection processing circuit 918 (represented as block 624). The received data is de-interleaved by local/global channel interleaver/de-interleaver circuit 994. The resulting de-interleaved output is provided to channel detector circuit 917 via connection 982 where a detection algorithm is applied. The resulting detected output from detector circuit 917 is provided to local/global channel interleaver/de-interleaver circuit 994 via connection 982 where it is interleaved. The interleaved result is provided back to centralized queue circuit 920. Overlapping the same period (represented as block 606), where codeword C failed to converge during the decoding process, codeword C is retrieved from centralized queue circuit 920 and processed by detection processing circuit 928 (represented as block 633). The received data is de-interleaved by local/global channel interleaver/de-interleaver circuit 996. The resulting de-interleaved output is provided to channel detector circuit 927 via connection 983 where a detection algorithm is applied. The resulting detected output from detector circuit 927 is provided to local/global channel interleaver/de-interleaver circuit 996 via connection 983 where it is interleaved. The interleaved result is provided back to centralized queue circuit 920.

Figure 11:
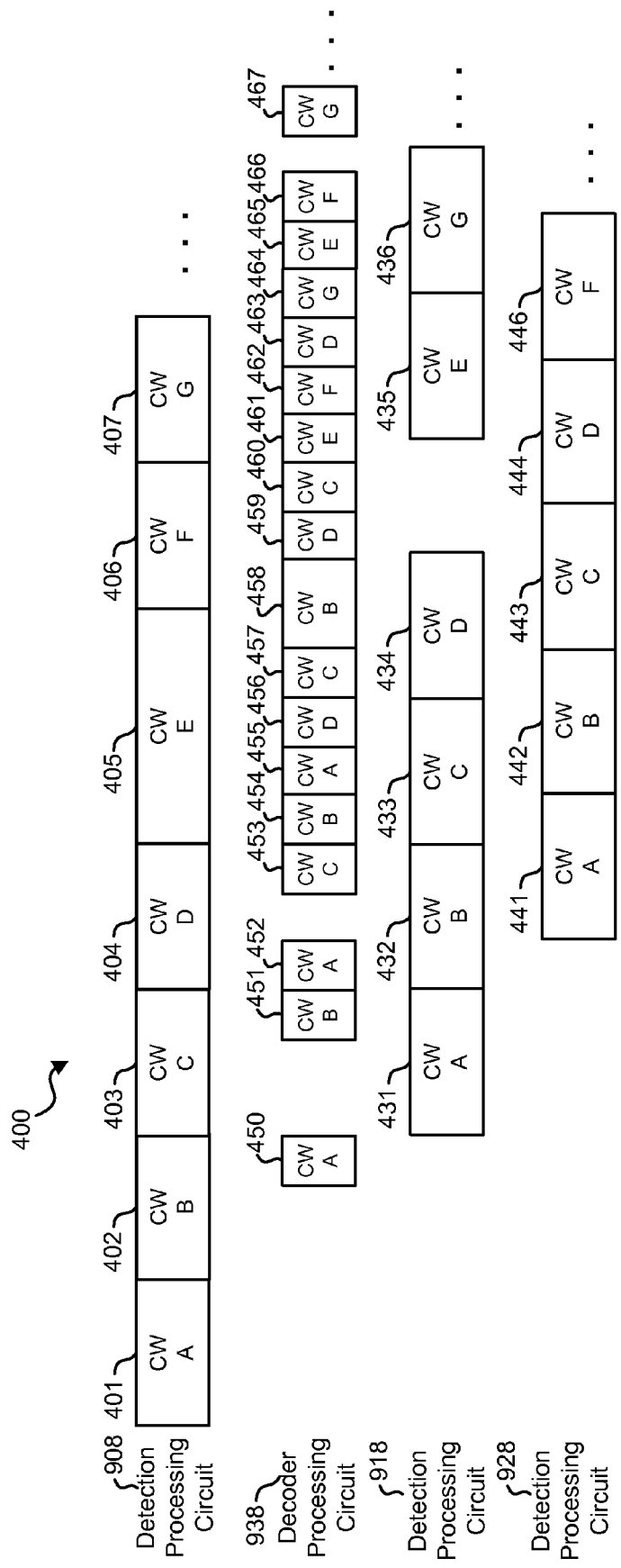
FIG. 11 is a timing diagram showing scheduling of the decoder and detectors of the centralized memory queuing detection/decoding system of FIG. 9 where three fixed global iterations are used along with a variable number of local iterations in accordance with some embodiments of the present invention.

Turning to FIG. 11, a timing diagram 400 shows scheduling of decoder processing circuit 938 and detection processing circuits 908, 918, 928 of centralized memory queuing detection/decoding system 900 where three fixed global iterations are used along with a variable number of local iterations in accordance with some embodiments of the present invention. Following timing diagram 400, a codeword A is provided to detection processing circuit 908 via input 905 (represented as block 401). Channel detector circuit 909 performs a detection algorithm on the received input and provides detected output 981 to local/global channel interleaver circuit 992. Local/global channel interleaver circuit 992 interleaves the detected output and writes the interleaved output to centralized queue circuit 920. A codeword B is provided to detection processing circuit 908 via input 905 (represented as block 402). As with codeword A, channel detector circuit 909 performs a detection algorithm on the received input and provides detected output 981 to local/global channel interleaver circuit 992; and local/global channel interleaver circuit 992 interleaves the detected output and writes the interleaved output to centralized queue circuit 920. During the same time period (represented as block 402), decoder processing circuit 938 accesses the interleaved codeword A from centralized queue circuit 920 and performs a decoding algorithm on the retrieved data (represented as block 450). Where codeword A fails to converge, the result of the decoding process is written back to centralize queue circuit 920.

A codeword C is provided to detection processing circuit 908 via input 905 (represented as block 403). Channel detector circuit 909 performs a detection algorithm on the received input and provides detected output 981 to local/global channel interleaver circuit 992; and local/global channel interleaver circuit 992 interleaves the detected output and writes the interleaved output to centralized queue circuit 920. During the same time period (represented as block 403), decoder processing circuit 938 accesses the interleaved codeword B from centralized queue circuit 920 and performs a decoding algorithm on the retrieved data (represented as block 451). Further, where codeword A failed to converge during the decoding process, codeword A is retrieved from centralized queue circuit 920 and processed by detection processing circuit 918 (represented as block 431). The received data is de-interleaved by local/global channel interleaver/de-interleaver circuit 994. The resulting de-interleaved output is provided to channel detector circuit 917 via connection 982 where a detection algorithm is applied. The resulting detected output from detector circuit 917 is provided to local/global channel interleaver/de-interleaver circuit 994 via connection 982 where it is interleaved. The interleaved result is provided back to centralized queue circuit 920.

A codeword D is provided to detection processing circuit 908 via input 905 (represented as block 404). Channel detector circuit 909 performs a detection algorithm on the received input and provides detected output 981 to local/global channel interleaver circuit 992; and local/global channel interleaver circuit 992 interleaves the detected output and writes the interleaved output to centralized queue circuit 920. During the same time period (represented as block 404), decoder processing circuit 938 accesses the interleaved codeword A from centralized queue circuit 920 and performs a decoding algorithm on the retrieved data (represented as block 452); and subsequently decoder processing circuit 938 accesses the interleaved codeword C from centralized queue circuit 920 and performs a decoding algorithm on the retrieved data (represented as block 453). Further, where codeword B failed to converge during the decoding process, codeword B is retrieved from centralized queue circuit 920 and processed by detection processing circuit 918 (represented as block 432). The received data is de-interleaved by local/global channel interleaver/de-interleaver circuit 994. The resulting de-interleaved output is provided to channel detector circuit 917 via connection 982 where a detection algorithm is applied. The resulting detected output from detector circuit 917 is provided to local/global channel interleaver/de-interleaver circuit 994 via connection 982 where it is interleaved. The interleaved result is provided back to centralized queue circuit 920. Overlapping the same period (represented as block 404), where codeword A failed to converge during the decoding process, codeword A is retrieved from centralized queue circuit 920 and processed by detection processing circuit 928 (represented as block 441). The received data is de-interleaved by local/global channel interleaver/de-interleaver circuit 996. The resulting de-interleaved output is provided to channel detector circuit 927 via connection 983 where a detection algorithm is applied. The resulting detected output from detector circuit 927 is provided to local/global channel interleaver/de-interleaver circuit 996 via connection 983 where it is interleaved. The interleaved result is provided back to centralized queue circuit 920.

A codeword E is provided to detection processing circuit 908 via input 905 (represented as block 405). Channel detector circuit 909 performs a detection algorithm on the received input and provides detected output 981 to local/global channel interleaver circuit 992; and local/global channel interleaver circuit 992 interleaves the detected output and writes the interleaved output to centralized queue circuit 920. Of note, the period used to receive and perform the data detection algorithm on codeword E is substantially longer than with other codewords. This change is due to, for example, additional local iterations by channel detector circuit 909, and has a ripple effect on the timing of other codeword processing. During the same time period (represented as block 405), decoder processing circuit 938 accesses the interleaved codeword B from centralized queue circuit 920 and performs a decoding algorithm on the retrieved data (represented as block 454); subsequently decoder processing circuit 938 accesses the interleaved codeword A from centralized queue circuit 920 and performs a decoding algorithm on the retrieved data (represented as block 455); subsequently decoder processing circuit 938 accesses the interleaved codeword D from centralized queue circuit 920 and performs a decoding algorithm on the retrieved data (represented as block 456); subsequently decoder processing circuit 938 accesses the interleaved codeword C from centralized queue circuit 920 and performs a decoding algorithm on the retrieved data (represented as block 457); and subsequently decoder processing circuit 938 accesses the interleaved codeword B from centralized queue circuit 920 and performs a decoding algorithm on the retrieved data (represented as block 458). Further, where codeword C failed to converge during the decoding process, codeword C is retrieved from centralized queue circuit 920 and processed by detection processing circuit 918 (represented as block 433). The received data is de-interleaved by local/global channel interleaver/de-interleaver circuit 994. The resulting de-interleaved output is provided to channel detector circuit 917 via connection 982 where a detection algorithm is applied. The resulting detected output from detector circuit 917 is provided to local/global channel interleaver/de-interleaver circuit 994 via connection 982 where it is interleaved. The interleaved result is provided back to centralized queue circuit 920. In addition, where codeword B failed to converge during the decoding process, codeword B is retrieved from centralized queue circuit 920 and processed by detection processing circuit 928 (represented as block 442). The received data is de-interleaved by local/global channel interleaver/de-interleaver circuit 996. The resulting de-interleaved output is provided to channel detector circuit 927 via connection 983 where a detection algorithm is applied. The resulting detected output from detector circuit 927 is provided to local/global channel interleaver/de-interleaver circuit 996 via connection 983 where it is interleaved. The interleaved result is provided back to centralized queue circuit 920. Overlapping the same period (represented as block 405), where codeword D failed to converge during the decoding process, codeword D is retrieved from centralized queue circuit 920 and processed by detection processing circuit 918 (represented as block 434). The received data is de-interleaved by local/global channel interleaver/de-interleaver circuit 994. The resulting de-interleaved output is provided to channel detector circuit 917 via connection 982 where a detection algorithm is applied. The resulting detected output from detector circuit 917 is provided to local/global channel interleaver/de-interleaver circuit 994 via connection 982 where it is interleaved. The interleaved result is provided back to centralized queue circuit 920. In addition, where codeword C failed to converge during the decoding process, codeword C is retrieved from centralized queue circuit 920 and processed by detection processing circuit 928 (represented as block 443). The received data is de-interleaved by local/global channel interleaver/de-interleaver circuit 996. The resulting de-interleaved output is provided to channel detector circuit 927 via connection 983 where a detection algorithm is applied. The resulting detected output from detector circuit 927 is provided to local/global channel interleaver/de-interleaver circuit 996 via connection 983 where it is interleaved. The interleaved result is provided back to centralized queue circuit 920.

A codeword F is provided to detection processing circuit 908 via input 905 (represented as block 406). Channel detector circuit 909 performs a detection algorithm on the received input and provides detected output 981 to local/global channel interleaver circuit 992; and local/global channel interleaver circuit 992 interleaves the detected output and writes the interleaved output to centralized queue circuit 920. During the same time period (represented as block 406), decoder processing circuit 938 finishes accessing interleaved codeword B from centralized queue circuit 920 and performs a decoding algorithm on the retrieved data (represented as block 458); subsequently decoder processing circuit 938 accesses the interleaved codeword D from centralized queue circuit 920 and performs a decoding algorithm on the retrieved data (represented as block 459); subsequently decoder processing circuit 938 accesses the interleaved codeword C from centralized queue circuit 920 and performs a decoding algorithm on the retrieved data (represented as block 460). Further, detection processing circuit 318 finishes performing the data detection process on codeword D (represented as block 434). Overlapping the same period (represented as block 406), where codeword D failed to converge during the decoding process, codeword D is retrieved from centralized queue circuit 920 and processed by detection processing circuit 928 (represented as block 444). The received data is de-interleaved by local/global channel interleaver/de-interleaver circuit 996. The resulting de-interleaved output is provided to channel detector circuit 927 via connection 983 where a detection algorithm is applied. The resulting detected output from detector circuit 927 is provided to local/global channel interleaver/de-interleaver circuit 996 via connection 983 where it is interleaved. The interleaved result is provided back to centralized queue circuit 920.

A codeword G is provided to detection processing circuit 908 via input 905 (represented as block 407). Channel detector circuit 909 performs a detection algorithm on the received input and provides detected output 981 to local/global channel interleaver circuit 992; and local/global channel interleaver circuit 992 interleaves the detected output and writes the interleaved output to centralized queue circuit 920. During the same time period (represented as block 407), decoder processing circuit 938 accesses the interleaved codeword E from centralized queue circuit 920 and performs a decoding algorithm on the retrieved data (represented as block 461); subsequently decoder processing circuit 938 accesses the interleaved codeword F from centralized queue circuit 920 and performs a decoding algorithm on the retrieved data (represented as block 462); and subsequently decoder processing circuit 938 accesses the interleaved codeword D from centralized queue circuit 920 and performs a decoding algorithm on the retrieved data (represented as block 463). Further, where codeword E failed to converge during the decoding process, codeword E is retrieved from centralized queue circuit 920 and processed by detection processing circuit 918 (represented as block 435). The received data is de-interleaved by local/global channel interleaver/de-interleaver circuit 994. The resulting de-interleaved output is provided to channel detector circuit 917 via connection 982 where a detection algorithm is applied. The resulting detected output from detector circuit 917 is provided to local/global channel interleaver/de-interleaver circuit 994 via connection 982 where it is interleaved. The interleaved result is provided back to centralized queue circuit 920. Overlapping the same period (represented as block 407), where codeword F failed to converge during the decoding process, codeword F is retrieved from centralized queue circuit 920 and processed by detection processing circuit 928 (represented as block 446). The received data is de-interleaved by local/global channel interleaver/de-interleaver circuit 996. The resulting de-interleaved output is provided to channel detector circuit 927 via connection 983 where a detection algorithm is applied. The resulting detected output from detector circuit 927 is provided to local/global channel interleaver/de-interleaver circuit 996 via connection 983 where it is interleaved. The interleaved result is provided back to centralized queue circuit 920. Further processing continues as illustrated by blocks 436, 463, 464, 465, 466, 467.

Figure 12:
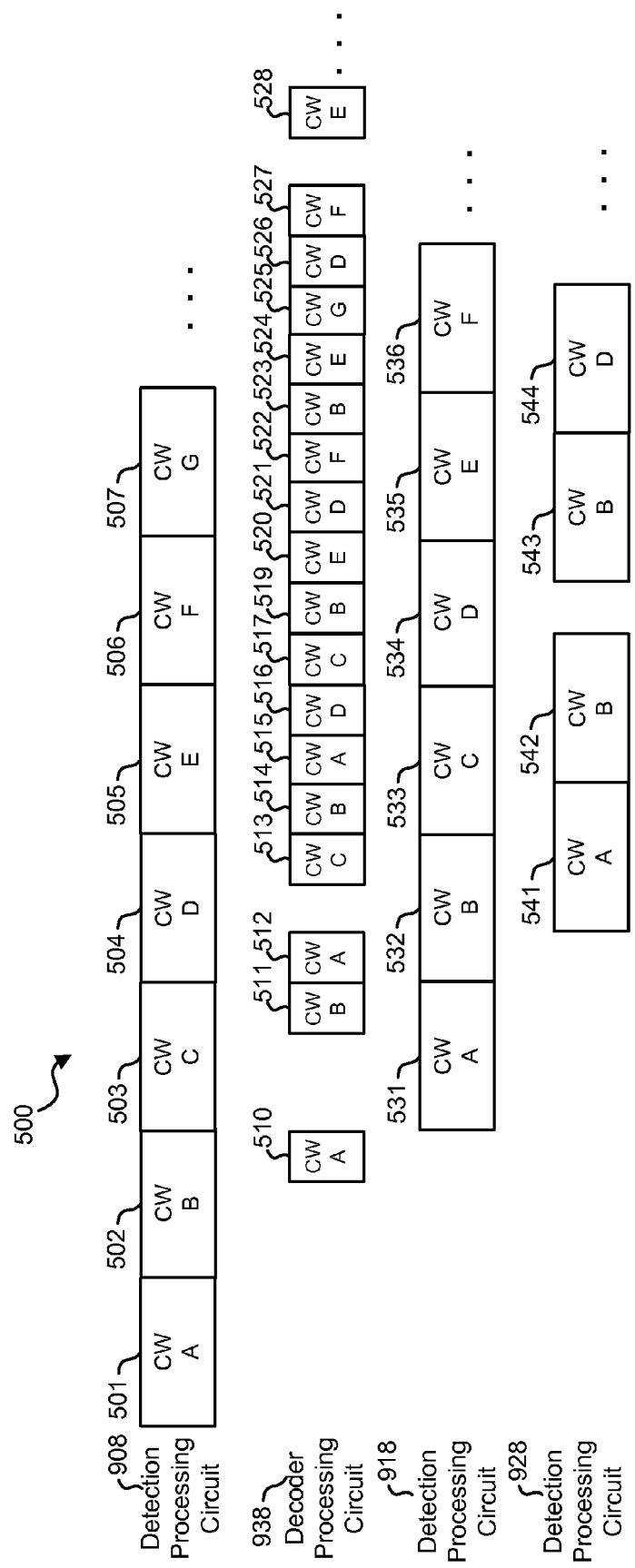
FIG. 12 is a timing diagram showing scheduling of the decoder and detectors of the centralized memory queuing detection/decoding system of FIG. 9 where variable global iterations are used along with a fixed number of local iterations in accordance with some embodiments of the present invention.

Turning to FIG. 12, a timing diagram 500 shows scheduling of decoder processing circuit 938 and detection processing circuits 908, 918, 928 of centralized memory queuing detection/decoding system 900 where variable global iterations are used along with a fixed number of local iterations in accordance with some embodiments of the present invention. Following timing diagram 500, a codeword A is provided to detection processing circuit 908 via input 905 (represented as block 501). Channel detector circuit 909 performs a detection algorithm on the received input and provides detected output 981 to local/global channel interleaver circuit 992. Local/global channel interleaver circuit 992 interleaves the detected output and writes the interleaved output to centralized queue circuit 920. A codeword B is provided to detection processing circuit 908 via input 905 (represented as block 502). As with codeword A, channel detector circuit 909 performs a detection algorithm on the received input and provides detected output 981 to local/global channel interleaver circuit 992; and local/global channel interleaver circuit 992 interleaves the detected output and writes the interleaved output to centralized queue circuit 920. During the same time period (represented as block 502), decoder processing circuit 938 accesses the interleaved codeword A from centralized queue circuit 920 and performs a decoding algorithm on the retrieved data (represented as block 510). Where codeword A fails to converge, the result of the decoding process is written back to centralize queue circuit 920.

A codeword C is provided to detection processing circuit 908 via input 905 (represented as block 503). Channel detector circuit 909 performs a detection algorithm on the received input and provides detected output 981 to local/global channel interleaver circuit 992; and local/global channel interleaver circuit 992 interleaves the detected output and writes the interleaved output to centralized queue circuit 920. During the same time period (represented as block 503), decoder processing circuit 938 accesses the interleaved codeword B from centralized queue circuit 920 and performs a decoding algorithm on the retrieved data (represented as block 511). Further, where codeword A failed to converge during the decoding process, codeword A is retrieved from centralized queue circuit 920 and processed by detection processing circuit 918 (represented as block 531). The received data is de-interleaved by local/global channel interleaver/de-interleaver circuit 994. The resulting de-interleaved output is provided to channel detector circuit 917 via connection 982 where a detection algorithm is applied. The resulting detected output from detector circuit 917 is provided to local/global channel interleaver/de-interleaver circuit 994 via connection 982 where it is interleaved. The interleaved result is provided back to centralized queue circuit 920.

A codeword D is provided to detection processing circuit 908 via input 905 (represented as block 504). Channel detector circuit 909 performs a detection algorithm on the received input and provides detected output 981 to local/global channel interleaver circuit 992; and local/global channel interleaver circuit 992 interleaves the detected output and writes the interleaved output to centralized queue circuit 920. During the same time period (represented as block 504), decoder processing circuit 938 accesses the interleaved codeword A from centralized queue circuit 920 and performs a decoding algorithm on the retrieved data (represented as block 512); and subsequently decoder processing circuit 938 accesses the interleaved codeword C from centralized queue circuit 920 and performs a decoding algorithm on the retrieved data (represented as block 513). Further, where codeword B failed to converge during the decoding process, codeword B is retrieved from centralized queue circuit 920 and processed by detection processing circuit 918 (represented as block 532). The received data is de-interleaved by local/global channel interleaver/de-interleaver circuit 994. The resulting de-interleaved output is provided to channel detector circuit 917 via connection 982 where a detection algorithm is applied. The resulting detected output from detector circuit 917 is provided to local/global channel interleaver/de-interleaver circuit 994 via connection 982 where it is interleaved. The interleaved result is provided back to centralized queue circuit 920. Overlapping the same period (represented as block 504), where codeword A failed to converge during the decoding process, codeword A is retrieved from centralized queue circuit 920 and processed by detection processing circuit 928 (represented as block 541). The received data is de-interleaved by local/global channel interleaver/de-interleaver circuit 996. The resulting de-interleaved output is provided to channel detector circuit 927 via connection 983 where a detection algorithm is applied. The resulting detected output from detector circuit 927 is provided to local/global channel interleaver/de-interleaver circuit 996 via connection 983 where it is interleaved. The interleaved result is provided back to centralized queue circuit 920.

A codeword E is provided to detection processing circuit 908 via input 905 (represented as block 505). Channel detector circuit 909 performs a detection algorithm on the received input and provides detected output 981 to local/global channel interleaver circuit 992; and local/global channel interleaver circuit 992 interleaves the detected output and writes the interleaved output to centralized queue circuit 920. During the same time period (represented as block 505), decoder processing circuit 938 accesses the interleaved codeword B from centralized queue circuit 920 and performs a decoding algorithm on the retrieved data (represented as block 514); subsequently decoder processing circuit 938 accesses the interleaved codeword A from centralized queue circuit 920 and performs a decoding algorithm on the retrieved data (represented as block 515); and subsequently decoder processing circuit 938 accesses the interleaved codeword D from centralized queue circuit 920 and performs a decoding algorithm on the retrieved data (represented as block 516). Further, where codeword C failed to converge during the decoding process, codeword C is retrieved from centralized queue circuit 920 and processed by detection processing circuit 918 (represented as block 533). The received data is de-interleaved by local/global channel interleaver/de-interleaver circuit 994. The resulting de-interleaved output is provided to channel detector circuit 917 via connection 982 where a detection algorithm is applied. The resulting detected output from detector circuit 917 is provided to local/global channel interleaver/de-interleaver circuit 994 via connection 982 where it is interleaved. The interleaved result is provided back to centralized queue circuit 920. Overlapping the same period (represented as block 505), where codeword B failed to converge during the decoding process, codeword B is retrieved from centralized queue circuit 920 and processed by detection processing circuit 928 (represented as block 542). The received data is de-interleaved by local/global channel interleaver/de-interleaver circuit 996. The resulting de-interleaved output is provided to channel detector circuit 927 via connection 983 where a detection algorithm is applied. The resulting detected output from detector circuit 927 is provided to local/global channel interleaver/de-interleaver circuit 996 via connection 983 where it is interleaved. The interleaved result is provided back to centralized queue circuit 920.

A codeword F is provided to detection processing circuit 908 via input 905 (represented as block 506). Channel detector circuit 909 performs a detection algorithm on the received input and provides detected output 981 to local/global channel interleaver circuit 992; and local/global channel interleaver circuit 992 interleaves the detected output and writes the interleaved output to centralized queue circuit 920. During the same time period (represented as block 506), decoder processing circuit 938 accesses the interleaved codeword C from centralized queue circuit 920 and performs a decoding algorithm on the retrieved data (represented as block 517); subsequently decoder processing circuit 938 accesses the interleaved codeword B from centralized queue circuit 920 and performs a decoding algorithm on the retrieved data (represented as block 519); and subsequently decoder processing circuit 938 accesses the interleaved codeword E from centralized queue circuit 920 and performs a decoding algorithm on the retrieved data (represented as block 520). Further, where codeword D failed to converge during the decoding process, codeword D is retrieved from centralized queue circuit 920 and processed by detection processing circuit 918 (represented as block 534). The received data is de-interleaved by local/global channel interleaver/de-interleaver circuit 994. The resulting de-interleaved output is provided to channel detector circuit 917 via connection 982 where a detection algorithm is applied. The resulting detected output from detector circuit 917 is provided to local/global channel interleaver/de-interleaver circuit 994 via connection 982 where it is interleaved. The interleaved result is provided back to centralized queue circuit 920. Overlapping the same period (represented as block 506), where codeword B failed to converge during the decoding process and it has the highest metrics and is selected for immediate re-processing in another global loop, codeword B is retrieved from centralized queue circuit 920 and processed by detection processing circuit 928 (represented as block 543). The received data is de-interleaved by local/global channel interleaver/de-interleaver circuit 996. The resulting de-interleaved output is provided to channel detector circuit 927 via connection 983 where a detection algorithm is applied. The resulting detected output from detector circuit 927 is provided to local/global channel interleaver/de-interleaver circuit 996 via connection 983 where it is interleaved. The interleaved result is provided back to centralized queue circuit 920.

A codeword G is provided to detection processing circuit 908 via input 905 (represented as block 507). Channel detector circuit 909 performs a detection algorithm on the received input and provides detected output 981 to local/global channel interleaver circuit 992; and local/global channel interleaver circuit 992 interleaves the detected output and writes the interleaved output to centralized queue circuit 920. During the same time period (represented as block 507), decoder processing circuit 938 accesses the interleaved codeword D from centralized queue circuit 920 and performs a decoding algorithm on the retrieved data (represented as block 521); subsequently decoder processing circuit 938 accesses the interleaved codeword F from centralized queue circuit 920 and performs a decoding algorithm on the retrieved data (represented as block 522); and subsequently decoder processing circuit 938 accesses the interleaved codeword B from centralized queue circuit 920 and performs a decoding algorithm on the retrieved data (represented as block 523). Further, where codeword E failed to converge during the decoding process, codeword E is retrieved from centralized queue circuit 920 and processed by detection processing circuit 918 (represented as block 535). The received data is de-interleaved by local/global channel interleaver/de-interleaver circuit 994. The resulting de-interleaved output is provided to channel detector circuit 917 via connection 982 where a detection algorithm is applied. The resulting detected output from detector circuit 917 is provided to local/global channel interleaver/de-interleaver circuit 994 via connection 982 where it is interleaved. The interleaved result is provided back to centralized queue circuit 920. Overlapping the same period (represented as block 507), where codeword D failed to converge during the decoding process, codeword D is retrieved from centralized queue circuit 920 and processed by detection processing circuit 928 (represented as block 544). The received data is de-interleaved by local/global channel interleaver/de-interleaver circuit 996. The resulting de-interleaved output is provided to channel detector circuit 927 via connection 983 where a detection algorithm is applied. The resulting detected output from detector circuit 927 is provided to local/global channel interleaver/de-interleaver circuit 996 via connection 983 where it is interleaved. The interleaved result is provided back to centralized queue circuit 920. During subsequent periods, processing continues with blocks 524, 525, 526, 527, 528, 536, 544.

Figure 13:
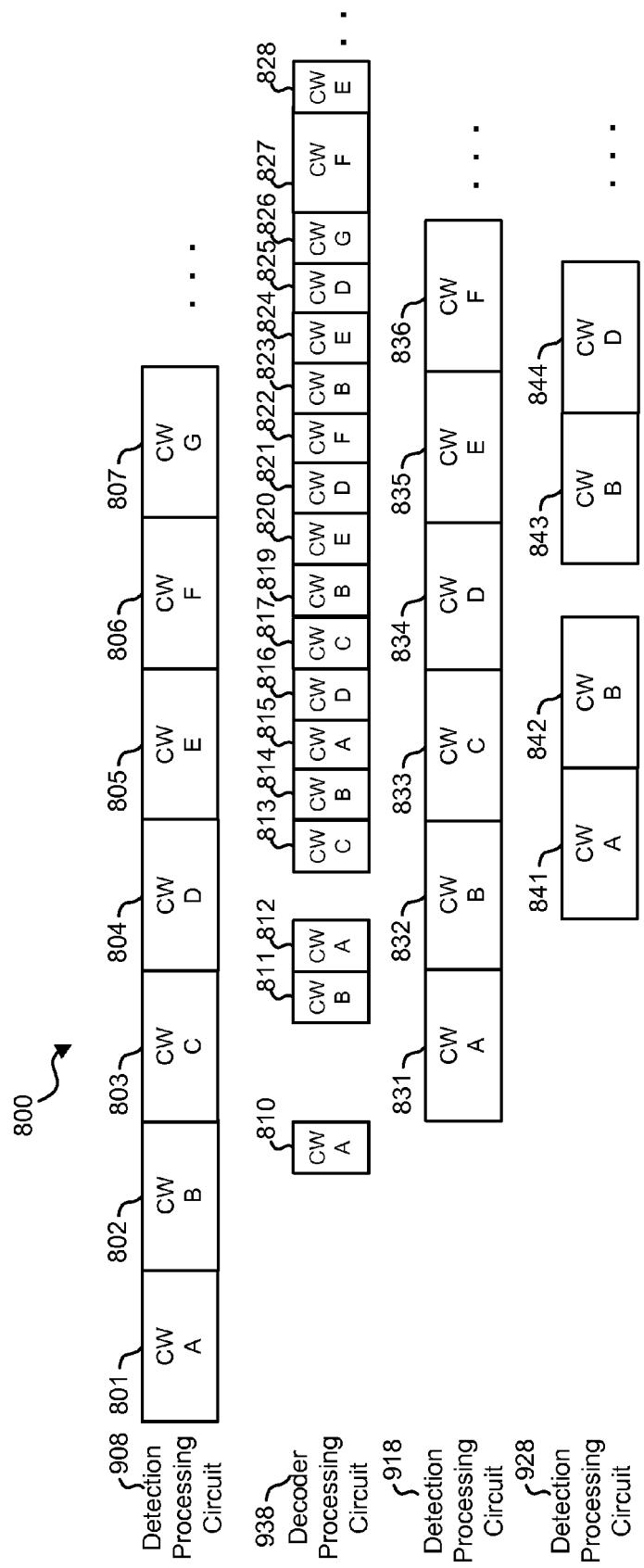
FIG. 13 is a timing diagram showing scheduling of the decoder and detectors of the centralized memory queuing detection/decoding system of FIG. 9 where a variable number of global iterations are used along with a variable number of local iterations in accordance with some embodiments of the present invention.

Turning to FIG. 13, a timing diagram 800 shows scheduling of decoder processing circuit 938 and detection processing circuits 908, 918, 928 of centralized memory queuing detection/decoding system 900 where a variable number of global iterations are used along with a variable number of local iterations in accordance with some embodiments of the present invention. Following timing diagram 800, a codeword A is provided to detection processing circuit 908 via input 905 (represented as block 801). Channel detector circuit 909 performs a detection algorithm on the received input and provides detected output 981 to local/global channel interleaver circuit 992. Local/global channel interleaver circuit 992 interleaves the detected output and writes the interleaved output to centralized queue circuit 920. A codeword B is provided to detection processing circuit 908 via input 905 (represented as block 802). As with codeword A, channel detector circuit 909 performs a detection algorithm on the received input and provides detected output 981 to local/global channel interleaver circuit 992; and local/global channel interleaver circuit 992 interleaves the detected output and writes the interleaved output to centralized queue circuit 920. During the same time period (represented as block 802), decoder processing circuit 938 accesses the interleaved codeword A from centralized queue circuit 920 and performs a decoding algorithm on the retrieved data (represented as block 810). Where codeword A fails to converge, the result of the decoding process is written back to centralize queue circuit 920.

A codeword C is provided to detection processing circuit 908 via input 905 (represented as block 803). Channel detector circuit 909 performs a detection algorithm on the received input and provides detected output 981 to local/global channel interleaver circuit 992; and local/global channel interleaver circuit 992 interleaves the detected output and writes the interleaved output to centralized queue circuit 920. During the same time period (represented as block 803), decoder processing circuit 938 accesses the interleaved codeword B from centralized queue circuit 920 and performs a decoding algorithm on the retrieved data (represented as block 811). Further, where codeword A failed to converge during the decoding process, codeword A is retrieved from centralized queue circuit 920 and processed by detection processing circuit 918 (represented as block 831). The received data is de-interleaved by local/global channel interleaver/de-interleaver circuit 994. The resulting de-interleaved output is provided to channel detector circuit 917 via connection 982 where a detection algorithm is applied. The resulting detected output from detector circuit 917 is provided to local/global channel interleaver/de-interleaver circuit 994 via connection 982 where it is interleaved. The interleaved result is provided back to centralized queue circuit 920.

A codeword D is provided to detection processing circuit 908 via input 905 (represented as block 804). Channel detector circuit 909 performs a detection algorithm on the received input and provides detected output 981 to local/global channel interleaver circuit 992; and local/global channel interleaver circuit 992 interleaves the detected output and writes the interleaved output to centralized queue circuit 920. During the same time period (represented as block 804), decoder processing circuit 938 accesses the interleaved codeword A from centralized queue circuit 920 and performs a decoding algorithm on the retrieved data (represented as block 812); and subsequently decoder processing circuit 938 accesses the interleaved codeword C from centralized queue circuit 920 and performs a decoding algorithm on the retrieved data (represented as block 813). Further, where codeword B failed to converge during the decoding process, codeword B is retrieved from centralized queue circuit 920 and processed by detection processing circuit 918 (represented as block 832). The received data is de-interleaved by local/global channel interleaver/de-interleaver circuit 994. The resulting de-interleaved output is provided to channel detector circuit 917 via connection 982 where a detection algorithm is applied. The resulting detected output from detector circuit 917 is provided to local/global channel interleaver/de-interleaver circuit 994 via connection 982 where it is interleaved. The interleaved result is provided back to centralized queue circuit 920. Overlapping the same period (represented as block 804), where codeword A failed to converge during the decoding process, codeword A is retrieved from centralized queue circuit 920 and processed by detection processing circuit 928 (represented as block 841). The received data is de-interleaved by local/global channel interleaver/de-interleaver circuit 996. The resulting de-interleaved output is provided to channel detector circuit 927 via connection 983 where a detection algorithm is applied. The resulting detected output from detector circuit 927 is provided to local/global channel interleaver/de-interleaver circuit 996 via connection 983 where it is interleaved. The interleaved result is provided back to centralized queue circuit 920.

A codeword E is provided to detection processing circuit 908 via input 905 (represented as block 805). Channel detector circuit 909 performs a detection algorithm on the received input and provides detected output 981 to local/global channel interleaver circuit 992; and local/global channel interleaver circuit 992 interleaves the detected output and writes the interleaved output to centralized queue circuit 920. During the same time period (represented as block 805), decoder processing circuit 938 accesses the interleaved codeword B from centralized queue circuit 920 and performs a decoding algorithm on the retrieved data (represented as block 814); subsequently decoder processing circuit 938 accesses the interleaved codeword A from centralized queue circuit 920 and performs a decoding algorithm on the retrieved data (represented as block 815); and subsequently decoder processing circuit 938 accesses the interleaved codeword D from centralized queue circuit 920 and performs a decoding algorithm on the retrieved data (represented as block 816). Further, where codeword C failed to converge during the decoding process, codeword C is retrieved from centralized queue circuit 920 and processed by detection processing circuit 918 (represented as block 833). The received data is de-interleaved by local/global channel interleaver/de-interleaver circuit 994. The resulting de-interleaved output is provided to channel detector circuit 917 via connection 982 where a detection algorithm is applied. The resulting detected output from detector circuit 917 is provided to local/global channel interleaver/de-interleaver circuit 994 via connection 982 where it is interleaved. The interleaved result is provided back to centralized queue circuit 920. Overlapping the same period (represented as block 805), where codeword B failed to converge during the decoding process, codeword B is retrieved from centralized queue circuit 920 and processed by detection processing circuit 928 (represented as block 842). The received data is de-interleaved by local/global channel interleaver/de-interleaver circuit 996. The resulting de-interleaved output is provided to channel detector circuit 927 via connection 983 where a detection algorithm is applied. The resulting detected output from detector circuit 927 is provided to local/global channel interleaver/de-interleaver circuit 996 via connection 983 where it is interleaved. The interleaved result is provided back to centralized queue circuit 920.

A codeword F is provided to detection processing circuit 908 via input 905 (represented as block 806). Channel detector circuit 909 performs a detection algorithm on the received input and provides detected output 981 to local/global channel interleaver circuit 992; and local/global channel interleaver circuit 992 interleaves the detected output and writes the interleaved output to centralized queue circuit 920. During the same time period (represented as block 806), decoder processing circuit 938 accesses the interleaved codeword C from centralized queue circuit 920 and performs a decoding algorithm on the retrieved data (represented as block 817); subsequently decoder processing circuit 938 accesses the interleaved codeword B from centralized queue circuit 920 and performs a decoding algorithm on the retrieved data (represented as block 819); and subsequently decoder processing circuit 938 accesses the interleaved codeword E from centralized queue circuit 920 and performs a decoding algorithm on the retrieved data (represented as block 820). Further, where codeword D failed to converge during the decoding process, codeword D is retrieved from centralized queue circuit 920 and processed by detection processing circuit 918 (represented as block 834). The received data is de-interleaved by local/global channel interleaver/de-interleaver circuit 994. The resulting de-interleaved output is provided to channel detector circuit 917 via connection 982 where a detection algorithm is applied. The resulting detected output from detector circuit 917 is provided to local/global channel interleaver/de-interleaver circuit 994 via connection 982 where it is interleaved. The interleaved result is provided back to centralized queue circuit 920. Overlapping the same period (represented as block 806), where codeword B failed to converge during the decoding process and it has the highest metrics and is selected for immediate re-processing in another global loop, codeword B is retrieved from centralized queue circuit 920 and processed by detection processing circuit 928 (represented as block 843). The received data is de-interleaved by local/global channel interleaver/de-interleaver circuit 996. The resulting de-interleaved output is provided to channel detector circuit 927 via connection 983 where a detection algorithm is applied. The resulting detected output from detector circuit 927 is provided to local/global channel interleaver/de-interleaver circuit 996 via connection 983 where it is interleaved. The interleaved result is provided back to centralized queue circuit 920.

A codeword G is provided to detection processing circuit 908 via input 905 (represented as block 807). Channel detector circuit 909 performs a detection algorithm on the received input and provides detected output 981 to local/global channel interleaver circuit 992; and local/global channel interleaver circuit 992 interleaves the detected output and writes the interleaved output to centralized queue circuit 920. During the same time period (represented as block 807), decoder processing circuit 938 accesses the interleaved codeword D from centralized queue circuit 920 and performs a decoding algorithm on the retrieved data (represented as block 821); subsequently decoder processing circuit 938 accesses the interleaved codeword F from centralized queue circuit 920 and performs a decoding algorithm on the retrieved data (represented as block 822); and subsequently decoder processing circuit 938 accesses the interleaved codeword B from centralized queue circuit 920 and performs a decoding algorithm on the retrieved data (represented as block 823). Further, where codeword E failed to converge during the decoding process, codeword E is retrieved from centralized queue circuit 920 and processed by detection processing circuit 918 (represented as block 835). The received data is de-interleaved by local/global channel interleaver/de-interleaver circuit 994. The resulting de-interleaved output is provided to channel detector circuit 917 via connection 982 where a detection algorithm is applied. The resulting detected output from detector circuit 917 is provided to local/global channel interleaver/de-interleaver circuit 994 via connection 982 where it is interleaved. The interleaved result is provided back to centralized queue circuit 920. Overlapping the same period (represented as block 807), where codeword D failed to converge during the decoding process, codeword D is retrieved from centralized queue circuit 920 and processed by detection processing circuit 928 (represented as block 844). The received data is de-interleaved by local/global channel interleaver/de-interleaver circuit 996. The resulting de-interleaved output is provided to channel detector circuit 927 via connection 983 where a detection algorithm is applied. The resulting detected output from detector circuit 927 is provided to local/global channel interleaver/de-interleaver circuit 996 via connection 983 where it is interleaved. The interleaved result is provided back to centralized queue circuit 920.

During subsequent periods, decoder processing circuit 938 accesses the interleaved codeword E from centralized queue circuit 920 and performs a decoding algorithm on the retrieved data (represented as block 824); accesses the interleaved codeword D from centralized queue circuit 920 and performs a decoding algorithm on the retrieved data (represented as block 825); accesses the interleaved codeword G from centralized queue circuit 920 and performs a decoding algorithm on the retrieved data (represented as block 826); accesses the interleaved codeword F from centralized queue circuit 920 and performs a decoding algorithm on the retrieved data (represented as block 827); and accesses the interleaved codeword E from centralized queue circuit 920 and performs a decoding algorithm on the retrieved data (represented as block 828). Of note, the duration of the decoding process of block 827 is substantially longer than other decoding processes due, for example, to an increased number of local decoding iterations.

Figure 14:
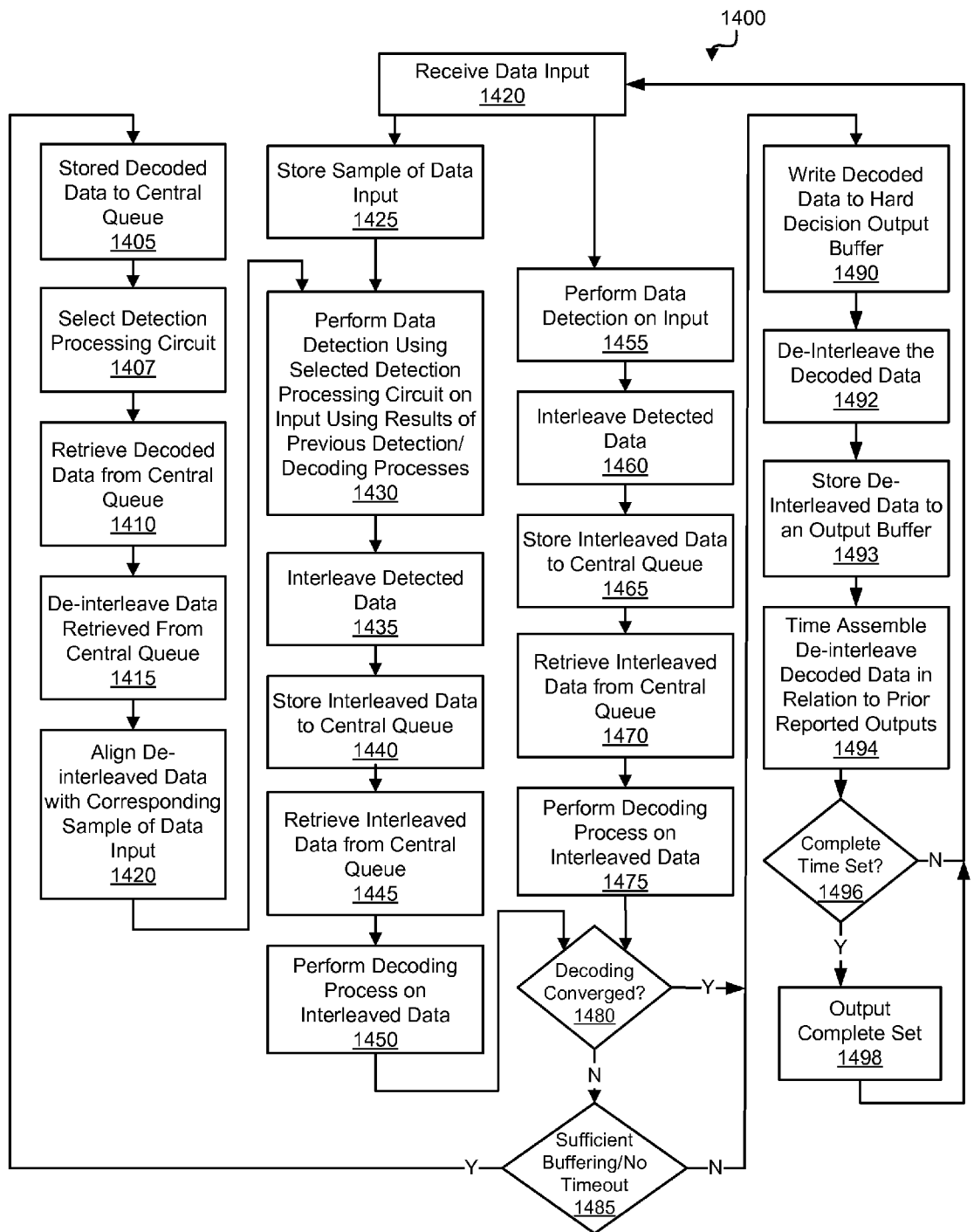
FIG. 14 is a flow diagram showing a method in accordance with one or more embodiments of the present invention for performing variable iterative detection and decoding processes.

Turning to FIG. 14, a flow diagram 1400 shows a method in accordance with some embodiments of the present invention for performing variable iterative detection and decoding processes. Following flow diagram 1400, a data input is received (block 1420). This data input may be, but is not limited to, a series of data bits received from a magnetic recording medium or a series of bits received from a transmission channel. Based on the disclosure provided herein, one of ordinary skill in the art will recognize a variety of sources and formats for the received data input. A sample of the received data is stored in memory buffer 913 and retained for later processing (block 1425). Data detection processes are performed on the received data by channel detector circuit 909 (block 1455), the detected data is interleaved by local/global channel interleaver circuit 992 (block 1460), and the interleaved data is stored to centralized queue circuit 920 (block 1465).

Once decoder processing circuit 938 is available as indicated by centralized queue scheduling circuit 925, the detected and interleaved data is retrieved from centralized queue circuit 920 and loaded into decoder memory circuit 934 (block 1470), and a decoding algorithm is applied to the retrieved data by LDPC decoder circuit 930 (block 1475). It is then determined whether the decoding process converged (block 1480). Where the decoding process failed to converged (block 1480), it is determined whether sufficient buffering (i.e., in one or more of centralized queue circuit 920, memory buffer 913, and/or output buffer 980) is available to perform another global iteration (i.e., a detection and a decoding process) on the result of the decoding process and if the data corresponding to the result of the decoding process is not subject to a timeout condition as controlled by centralized queue scheduling circuit 925 (block 1485). Where no time out condition exists and there is sufficient buffered available (block 1485), another global iteration is performed in accordance with blocks 1405, 1407, 1410, 1415, 1420, 1430, 1435, 1440, 1445, 1450 as discussed below. Otherwise, where either the decoding process converged (block 1480) or there is insufficient buffering or a timeout condition has occurred (block 1485), the output of the decoding process is prepared for output as discussed below in relation to blocks 1490, 1492, 1493, 1494, 1496, 1498.

Where either the decoding process converged (block 1480) or there is insufficient buffering or a timeout condition has occurred (block 1485), the decoded data is stored to decoder memory 339 (block 1490). The data is retrieved from decoder memory 339 and de-interleaved by local channel de-interleaver circuit 975 (block 1492), and the de-interleaved data is stored to output buffer 980 (block 1493). Output buffer 980 includes various results that may have become available out of order, and as such the various results are reordered in the buffer to represent the order in which the corresponding data input was originally received (block 1494). It is then determined if a complete time set is available in output buffer 980 (block 1496). A complete time set includes every result corresponding to received inputs over a given period of time. Thus, for example, where the first result is delayed while two later results are reported, the complete time set exists for the three results once the first result is finally available in the buffer. It should be noted that in some embodiments of the present invention that the results are reported out of order to a recipient. In such cases, there is no need to reorder results or to determine whether complete time sets are available. Where a complete time set is available (block 1496) or where the results are to be reported as they are received without regard to order, the result(s) are output to a recipient (block 1498).

Alternatively, where no time out condition exists and there is sufficient buffered available (block 1485), the process of detection and decoding (i.e., a global iteration) is repeated. In particular, the decoded data is stored to centralized queue circuit 920 (block 1405). It is then determined which of detection processing circuit 918 or detection processing circuit 928 will be used to perform the subsequent detection process (block 1407). Selection between detection processing circuit 918 and detection processing circuit 928 is done by determining whether detection processing circuit 918 is busy. Where detection processing circuit 918 is not busy, it is always selected to perform the next detection process. Alternatively, where detection processing circuit 918 is busy and detection processing circuit 928 is not busy, detection processing circuit 928 is selected to perform the next detection process. Where both detection processing circuit 918 and detection processing circuit 928 are busy, the detection processing circuit that will be available first is selected.

When the selected detection processing circuit is available, the decoded data is retrieved from centralized queue circuit 920 (block 1410), and the retrieved data is de-interleaved by the de-interleaver circuit associated with the selected detection processing circuit (block 1415). The de-interleaved data is then aligned with its corresponding original data set that was originally stored as a sample in memory buffer 913 (block 1420). The de-interleaved data and the corresponding sample data input is provided to the data detector circuit associated with the selected detection processing circuit data detector where a subsequent data detection is performed (block 1430) using the soft input developed in the earlier processing of the same data input (blocks 1455, 1460, 1465, 1470, 1475). The result of the data detection process is interleaved using the interleaver circuit associated with the selected detection processing circuit (block 1435) and the interleaved data is stored to centralized queue circuit 920 (block 1440). When the decoder is again available, the interleaved data is retrieved from the centralized queue circuit (block 1445), and the decoding process is applied by decoder processing circuit 938 to the retrieved data (block 1450). At this point, it is determined whether the data detection and decoding process is to be repeated (blocks 1405, 1407, 1410, 1415, 1425, 1430, 1435, 1440, 1445, 1450) or whether the result is to be reported (blocks 1490, 1492, 1493, 1494, 1496, 1498).

In conclusion, the invention provides novel systems, devices, methods and arrangements for performing iterative data decoding and/or detection. While detailed descriptions of one or more embodiments of the invention have been given above, various alternatives, modifications, and equivalents will be apparent to those skilled in the art without varying from the spirit of the invention. For example, one or more embodiments of the present invention may be applied to various data storage systems and digital communication systems, such as, for example, tape recording systems, optical disk drives, wireless systems, and digital subscribe line systems. Therefore, the above description should not be taken as limiting the scope of the invention, which is defined by the appended claims.

What is claimed is:

1. A data processing system, the system comprising:
a first detection processing circuit operable to process a first codeword;
a second detection processing circuit operable to process a second codeword concurrent with the first detection processing circuit operating on the first codeword;
a decoder processing circuit; and
a memory, wherein the memory is coupled to the first detection processing circuit, the second data detection processing circuit, and the decoder processing circuit.

2. The data processing system of claim 1, wherein the system further comprises:
a scheduling circuit, wherein the scheduling circuit is operable to govern access to the memory by the first detection processing circuit, the second detection processing circuit and the decoder processing circuit.

3. The data processing system of claim 1, wherein the first detection processing circuit includes a detector circuit and an interleaver circuit, and wherein access to the memory by the first detection processing circuit includes providing an interleaved output from the detector circuit to the memory.

4. The data processing system of claim 3, wherein the detector circuit is operable to receive a data input and to provide a detected output based at least in part on the data input, and wherein the interleaver circuit is operable to receive the detected output and to provide the interleaved output based at least in part on the detected output.

5. The data processing system of claim 1, wherein the second detection processing circuit includes a detector circuit, an interleaver circuit and a de-interleaver circuit, wherein a write access to the memory by the second detection processing circuit includes providing a detected output from the detector circuit to the memory via the interleaver circuit, and wherein a read access from the memory by the detection processing circuit includes receiving an interleaved output from the memory at the de-interleaver circuit.

6. The data processing system of claim 5, wherein upon a read access from the memory, the de-interleaver circuit is operable to receive an interleaved output from the memory and to provide a de-interleaved output to the detector circuit based at least in part on the interleaved output.

7. The data processing system of claim 6, wherein the read access from the memory by the second detection processing circuit only occurs where a decoding algorithm applied by the decoder processing circuit fails to converge.

8. The data processing system of claim 5, wherein upon a write access to the memory, the detector circuit is operable to receive a buffered data input and to provide a detected output based at least in part on the buffered data input, and wherein the interleaver circuit is operable to receive the detected output and to provide the interleaved output based at least in part on the detected output.

9. The data processing system of claim 1, wherein the memory is a central memory, and wherein the decoder processing circuit includes a decoder circuit and a ping-pong memory having a first memory region and a second memory region.

10. The data processing system of claim 9, wherein the decoder circuit is a low density parity check decoder circuit.

11. The data processing system of claim 9, wherein upon a read access from the memory by the decoder processing circuit, a data set from the memory is written to the first memory region while the decoder circuit processes data from the second memory region.

12. The data processing system of claim 9, wherein upon a write access to the memory by the decoder processing circuit, a data set from the first memory region is provided to the memory while the decoder circuit processes data from the second memory region.

13. The data processing system of claim 9, wherein the ping-pong memory is a first ping-pong memory, and wherein the decoder processing circuit further comprises a second ping-pong memory having a third memory region and a fourth memory region.

14. The data processing system of claim 13, wherein the system further comprises a de-interleaver circuit and an output buffer, and wherein upon convergence the decoder circuit writes data to the third memory region while data is provided from the fourth memory region to the output buffer via the de-interleaver circuit.

15. A storage device, the storage device comprising:
a storage medium, wherein the storage medium is operable to store a data set;
a data processing circuit, wherein the data processing circuit is operable to receive a representation of the data set, and wherein the data processing circuit includes:
a memory, wherein the memory is coupled to a first detection processing circuit, a second detection processing circuit, and a decoder processing circuit;
wherein the first detection processing circuit is operable to apply a detection algorithm to the representation of the data set and to provide a first detected output to the memory;
wherein the decoder processing circuit is operable to apply a decoding algorithm to the first detected output and to provide a decoded output to the memory; and
wherein the second detection processing circuit is operable to apply the detection algorithm to the decoded and to provide a second detected output to the memory.

16. The storage device of claim 15, wherein the device further comprises:
wherein the first detection processing circuit includes a detector circuit and an interleaver circuit, and wherein access to the memory by the first detection processing circuit includes providing an interleaved output from the detector circuit to the memory.

17. The storage device of claim 15, wherein the second detection processing circuit includes a detector circuit, an interleaver circuit and a de-interleaver circuit, wherein a write access to the memory by the second detection process includes providing a detected output from the detector circuit to the memory via the interleaver circuit, and wherein a read access from the memory by the detector circuit includes receiving an interleaved output from the memory at the de-interleaver circuit.

18. The storage device of claim 15, wherein the memory is a central memory, and wherein the decoder processing circuit includes a decoder circuit and a ping-pong memory having a first memory region and a second memory region.

19. An information transmission device, the information transmission device comprising:
a radio frequency receiver, wherein the radio frequency receiver is operable to receive a data set;
a data processing circuit, wherein the data processing circuit is operable to receive a representation of the data set, and wherein the data processing circuit includes:
a memory, wherein the memory is coupled to a first detection processing circuit, a second detection processing circuit, and a decoder processing circuit;
wherein the first detection processing circuit is operable to apply a detection algorithm to the representation of the data set and to provide a first detected output to the memory;
wherein the decoder processing circuit is operable to apply a decoding algorithm to the first detected output and to provide a decoded output to the memory; and
wherein the second detection processing circuit is operable to apply the detection algorithm to the decoded and to provide a second detected output to the memory.

20. The information transmission device of claim 19, wherein the first detection processing circuit includes a first detector circuit and a first interleaver circuit, and wherein access to the memory by the first detection processing circuit includes providing a first interleaved output from the first detector circuit to the memory; wherein the second detection processing circuit includes a second detector circuit, a second interleaver circuit and a de-interleaver circuit, wherein a write access to the memory by the second detection process includes providing a second detected output from the second detector circuit to the memory via the second interleaver circuit, and wherein a read access from the memory by the detector circuit includes receiving a second interleaved output from the memory at the de-interleaver circuit.

* * * * *